United States Patent
Kijima et al.

(10) Patent No.: US 7,187,575 B2
(45) Date of Patent: Mar. 6, 2007

(54) MEMORY DEVICE AND ITS MANUFACTURING METHOD

(75) Inventors: Takeshi Kijima, Matsumoto (JP); Satoshi Inoue, Chino (JP)

(73) Assignee: Seiko Epson Corporation (JP)

( * ) Notice: Subject to any disclaimer, the term of this patent is extended or adjusted under 35 U.S.C. 154(b) by 178 days.

(21) Appl. No.: 10/858,498

(22) Filed: Jun. 1, 2004

(65) Prior Publication Data

US 2005/0068822 A1 Mar. 31, 2005

(51) Int. Cl.
*G11C 11/22* (2006.01)

(52) U.S. Cl. .................. 365/145; 365/149; 257/295

(58) Field of Classification Search .............. 365/145, 365/149, 189.01; 257/295, 296
See application file for complete search history.

(56) References Cited

U.S. PATENT DOCUMENTS

| | | | |
|---|---|---|---|
| 5,303,182 A | | 4/1994 | Nakao et al. |
| 5,702,963 A | | 12/1997 | Vu et al. |
| 5,739,563 A | * | 4/1998 | Kawakubo et al. ......... 257/295 |
| 5,751,037 A | | 5/1998 | Aozasa et al. |
| 5,917,221 A | * | 6/1999 | Takemura ................... 257/365 |
| 6,140,672 A | | 10/2000 | Arita et al. |
| 6,844,582 B2 | * | 1/2005 | Ueda et al. ................. 257/295 |
| 6,914,281 B2 | * | 7/2005 | Tanaka ....................... 257/295 |
| 7,038,261 B2 | * | 5/2006 | Horii .......................... 257/295 |
| 2003/0022403 A1 | | 1/2003 | Shimoda et al. |

FOREIGN PATENT DOCUMENTS

| | | |
|---|---|---|
| DE | 102 23 505 | 12/2003 |
| EP | 1 555 678 | 10/2003 |
| WO | WO 2004/038733 | 5/2004 |

OTHER PUBLICATIONS

European Search Report issued in corresponding application.

* cited by examiner

*Primary Examiner*—Gene N. Auduong
(74) *Attorney, Agent, or Firm*—Harness, Dickey & Pierce, P.L.C.

(57) ABSTRACT

A memory device includes a semiconductor substrate, a transistor formed by using the semiconductor substrate, and a capacitor connected to the semiconductor substrate. Changes in electric conductivity of the semiconductor substrate are used as different data, and the transistor reads the data. By changing the amount of charge stored in the capacitor, a density of carriers (electrons) of the semiconductor substrate is changed.

12 Claims, 19 Drawing Sheets

FIG. 7 (A)  SCHEMATIC DIAGRAM OF SIMPLE MATRIX TYPE FERROELECTRIC MEMORY ARRAY
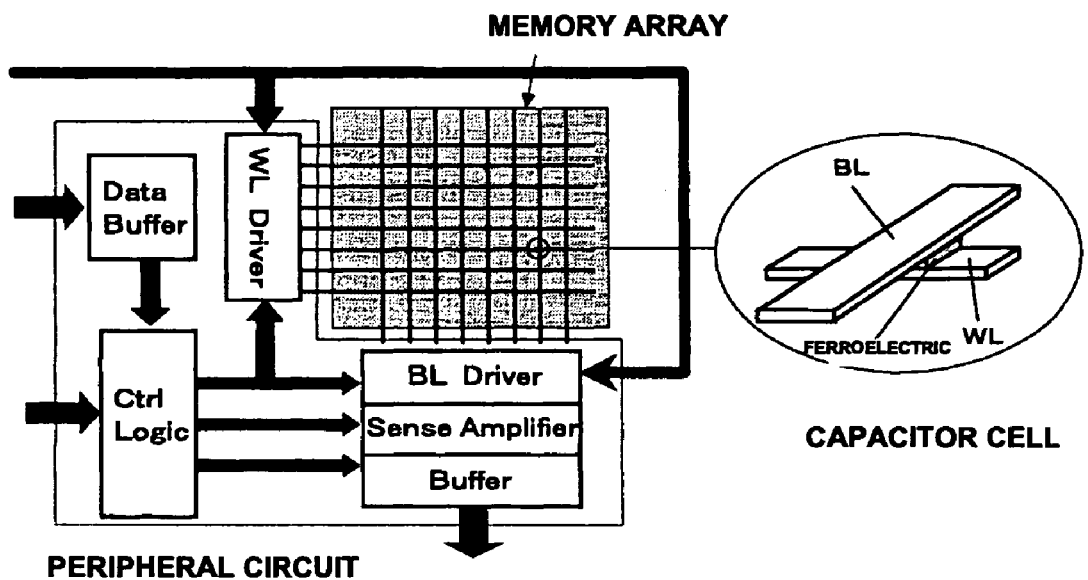
FIG. 7 (B)  CIRCUIT DIAGRAM OF SIMPLE MATRIX TYPE MEMORY
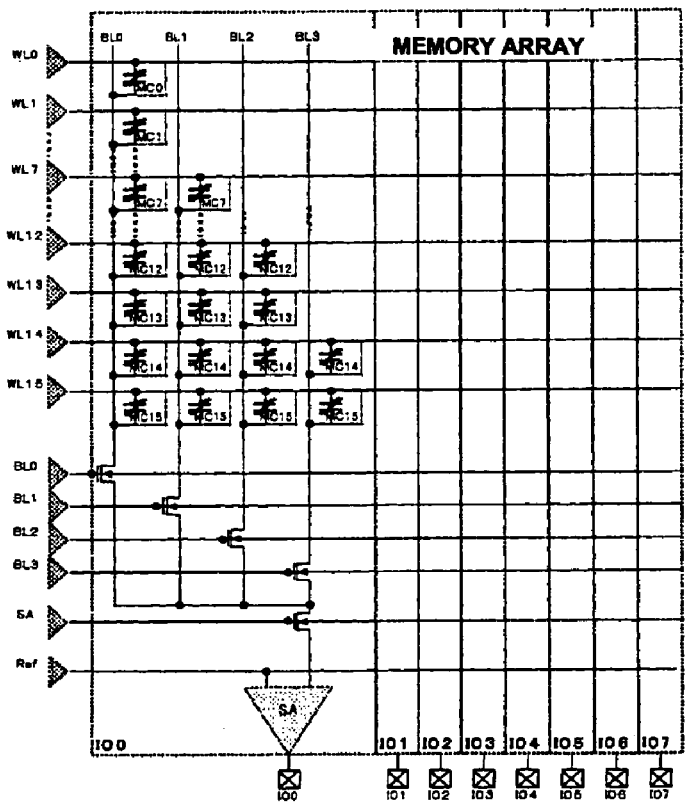

Fail Bit Map (L/S=2.0/1.2)

FERROELECTRIC CAPACITOR SECTION

TFT SECTION

NON-DESTRUCTIVE RAED SYSTEM SIMPLE
MATRIX TYPE FERROELECTRIC MEMORY ARRAY

MEMORY DEVICE AND ITS MANUFACTURING METHOD

FIELD OF THE INVENTION

The present invention relates to a ferroelectric memory device that is composed by using ferroelectric capacitors.

DESCRIPTION OF RELATED ART

In recent years, research and development of thin films such as PZT and SBT, and ferroelectric capacitors, ferroelectric memory devices and the like using these thin films have been extensively conducted. The structure of ferroelectric memory devices is roughly divided into a one transistor (1T) type, one transistor and one capacitor (1T1C) type, two transistors and two capacitors (2T2C) type, and a simple matrix type that does not include any selection transistors.

Because the 1T1C type and 2T2C type have substantially the same structure as that of a DRAM, and include selection transistors, such that they can take advantage of the DRAM manufacturing technology, and realize write speeds comparable to those of SRAMs, they have been manufactured so far into commercial products with a small capacity of 256-kbit or less, but most of the products that are actually commercialized, except a very small amount of 1T1C type, are 2T2C type. The reason for using two capacitors is to prevent data reading errors from occurring due to unstable characteristic of the ferroelectric capacitors. To prevent data reading errors, the same data (whose signs are opposite) are written in two capacitors, to double the storage capacity of the capacitor to prevent data errors.

Furthermore, a 2T2C type has a complex cell structure, and its cell area is very large because it is formed from two transistors and two ferroelectric capacitors, which prevents further integration.

With 2T2C type including 1T1C type, a constant voltage is applied to read data without regard to the directions of polarization of the ferroelectrics. In this instance, due to the difference in the directions of polarization, one of them is inverted, and a difference in the amount of current flowing at this moment is amplified, read and judged as different data. Accordingly, all the ferroelectrics are polarized in the same direction after reading, and thus a polarization reverse operation is required for writing data again. The above reading method is called destructive reading.

On the other hand, a simple matrix type has a smaller cell size compared to the 1T1C type and 2T2C type and allows multilayering of capacitors, such that a higher integration and a cost reduction are expected. Conventional simple matrix type ferroelectric memory devices are described in Japanese Laid-open Patent Application HEI 9-116107 and the like. This Laid-open Patent Application describes a drive method in which a voltage that is one-third a write voltage is applied to nonselected memory cells when writing data into the memory cells. However, this technology does not provide concrete description relating to hysteresis loop of the ferroelectric capacitor required for the operation. The present inventors have found in the course of development that a hysteresis loop having good squareness is indispensable to obtain a simple matrix type ferroelectric memory device which can be operated in practice. As a ferroelectric material that can handle such a requirement, Ti rich tetragonal PZT can be considered as a candidate, and it is the most important task to secure its reliability like the aforementioned 1T1C type and 2T2C type ferroelectric memory devices.

Further, a 1T type ferroelectric memory, which replaces a gate oxide film of a transistor with a ferroelectric material thin film, has been proposed as an ultimate memory.

This uses polarization inversion of the ferroelectric to control the depletion layer of the semiconductor, thereby non-destructively reading the rectification characteristic of a transistor as two values according to different polarization directions.

The cell configuration includes one transistor, which is also effective in greater integration.

However, the 1T type ferroelectric memory, although more than fifty years have already elapsed since its proposal, has not been realized. The great difficulty is that ferroelectric oxide must be formed on a semiconductor surface such as Si that is readily oxidized, such that deterioration of the semiconductor characteristic of the semiconductor substrate itself such as Si and deterioration of crystallinity of the ferroelectric material by oxidation of the surface of semiconductor substrate such as Si and diffusion of the ferroelectric composing element cannot be avoided.

In this connection, a structure in which a dielectric layer such as $SiO_2$, SiN, $Al_2O_3$, $HfO_3$, and the like for preventing diffusion is sandwiched between a ferroelectric thin film and a semiconductor substrate is currently considered most. However, this method still entails many difficulties.

One of them is a mismatch in the relative dielectric constant between a diffusion prevention dielectric layer and a ferroelectric material. A dielectric film material used as a diffusion prevention layer has a relative dielectric constant of four-tens, and a ferroelectric layer has a relative dielectric constant of hundreds-thousands to tens of thousands. When they are serially connected, a voltage is scarcely applied to the ferroelectric material. Accordingly, the dielectric film is thinned to several nm, and the ferroelectric film is thickened to gain a voltage that can be applied to the ferroelectric film. However, according to this method, when an excessive voltage is applied, a dielectric breakdown occurs in the dielectric film. As a result, this causes a problem in that an effective saturation voltage cannot be applied to the ferroelectric. Also, thickening of the ferroelectric layer is against the circuit integration, which also presents a substantial problem. As a result of the above, when polarization inversion is caused in the ferroelectric layer by a voltage that is lower than the breakdown voltage of the dielectric layer, stable saturated hysteresis cannot be used, and unstable hysteresis called minor loop hysteresis is used instead, which leads to deterioration of the memory characteristics.

Also, although the amount of stored charge in ferroelectric differs depending on the material, and is about 10–100 $\mu C/cm^2$, merely 1 $\mu C/cm^2$ or less is sufficient for the channel operation (for controlling a depletion layer) of the semiconductor surface, and if it is greater than this amount, a difference in the rectification characteristics due to polarization inversion is hard to appear. In both of the cases, current is difficult to flow. In this connection, attempts are made to artificially reduce polarization values of ferroelectric materials. This includes a method to reduce an area of only an upper electrode of a ferroelectric thin film to about 1/10–1/20. By this, hysteresis whose saturation polarization value Ps is apparently reduced to a small value can be used, and a saturated hysteresis loop can be used. This may ensure the stability of the memory characteristics. However, although the 1T structure has a small cell area and can be integrated to a high level, its integration cannot be achieved because formation of the upper electrode is rate-limiting.

Also, in the 1T type, a stored charge from a ferroelectric capacitor at a gate section of a transistor becomes a gate voltage, and therefore there is no degree of freedom at all in selecting a gate voltage to match the transistor characteristics.

Furthermore, due to its structure, its retention (data retention) is as short as one month since an internal electric field inevitably occurs in the capacitor, and it is said to be impossible to ensure a 10-year guarantee generally required for semiconductors.

Lastly, ferroelectric memories in general entail a big problem. That is, the semiconductor process such as, formation of transistors, formation of interlayer dielectric films, passivation, and the like, is mostly conducted in a hydrogen atmosphere, but a ferroelectric thin film forming process needs to be conducted in an oxygen atmosphere because the ferroelectric material is an oxide. This poses a big problem so long as they are formed on the same semiconductor substrate.

For example, let us consider a 2T2C type memory in the current state. First, transistors are formed on a semiconductor substrate such as Si, and the entire area is covered with an interlayer dielectric film. A hydrogen process is conducted up to this point.

Then, an oxygen process is conducted in which ferroelectric capacitors are formed on the interlayer dielectric layer through W plugs or the like. Thereafter, if only a memory device function is to be provided, after forming electrodes, hydrogen sinter and passivation are conducted, and then packaging is conducted. The hydrogen sinter and passivation processes are hydrogen processes.

Some of the major problems that emerge in the aforementioned processes are listed below.

Although the reason why the ferroelectric capacitors are formed through plugs or the like after forming the interlayer dielectric film must be to separate the hydrogen process from the oxygen process, in effect, heat histories are frequently repeated in oxygen in the process of forming the ferroelectric capacitors, which change the characteristics of the lowermost transistors. For this reason, hydrogen sinter is conducted at a lower temperature after the ferroelectric capacitors are formed, to approximate the transistor characteristics to the designed characteristics. However, this hydrogen sinter reduces the ferroelectric, which deteriorates its characteristics. An oxidation process is conducted at a low temperature to regain the original characteristics and to thereby improve the ferroelectric characteristics, but they are not completely returned to the original.

In other words, the current ferroelectric memory process does not combine good characteristics of transistors and ferroelectric capacitors, but combines them at a tolerable level while degrading the characteristics of the two.

Also, in order to prevent the ferroelectric from hydrogen reduction as much as possible, processings to form oxide films having barrier characteristics in many layers around a ferroelectric film are almost always required. Consequently, this is causing substantial problems, such as, substantial increases in the number of processes and the cost.

SUMMARY OF THE INVENTION

It is an object of the present invention to provide a ferroelectric memory having a completely novel cell structure that almost perfectly solves the aforementioned problems of 1T1C, 2T2C, simple matrix type and 1T type ferroelectric memories described above, and is capable of non-destructive reading.

It has been found that a novel ferroelectric memory in accordance with the present invention can solve all the problems described above by using changes in the electric conductivity of a semiconductor substrate itself as different data, and by using transistors formed by using the semiconductor substrate as a memory device that performs data reading.

More specifically, ferroelectric capacitors disposed in a simple matrix structure are formed, and each of the capacitors is connected to a circuit for writing data.

Similarly, transistors disposed in a simple matrix structure are formed, and each of the capacitors is connected to a circuit for reading data.

Further, the ferroelectric capacitors disposed in a simple matrix structure and the transistors disposed in a simple matrix structure are respectively connected one to one, each through one of electrodes of the ferroelectric capacitor, the semiconductor substrate itself of the transistor and a dielectric layer.

In other words, like a conventional ferroelectric memory, data is written in a section of the ferroelectric capacitor. In this instance, since the ferroelectric capacitor is directly connected to the semiconductor substrate, when the amount of stored charge changes due to a difference in the polarization direction of the ferroelectric capacitor, the density of carriers (electrons) in the semiconductor substrate is changed.

In this instance, an ordinary reading operation is conducted with respect to the transistors disposed in a simple matrix structure. In other words, when a predetermined voltage is applied to the gate to inject electrons from the source, a drain current that flows at this moment indicates a current value that reflects the change in the carrier density of the semiconductor substrate itself.

In other words, a difference in write data due to the polarization inversion of the ferroelectric can be read out as a difference in the drain current. Also, the ferroelectric does not need to be inverted during a series of those operations, in other words, a so-called non-destructive reading method can be performed.

Also, because a simple matrix configuration is used, and each transistor is disposed directly above each capacitor, the area occupied by each cell is determined by either the capacitor or the transistor that has a greater area. Principally, they can have the same area, and the area per each cell corresponds to the area of each capacitor, which is possibly the smallest occupying area. Accordingly, this provides the most effective configuration for a high degree of integration.

Also, unlike the 1T type, the gate of the transistor has an ordinary gate structure, and a gate voltage for merely reading data, which matches with the characteristics of the transistor, can be selected.

Furthermore, although the charge stored in the ferroelectric capacitor is connected to the semiconductor substrate through the dielectric layer, the dielectric layer does not need to be forcefully thinned down like the 1T type, and can be formed in a thickness that can sufficiently transfer the ferroelectric characteristics as it is without forcing it.

In other words, the amount of change in the carrier density of the semiconductor substrate is determined through optimization of the thickness of the dielectric film at a junction section between the ferroelectric capacitor and the semiconductor substrate; and by optimizing the gate voltage, a change in the amount of stored charge caused by polarization inversion of the ferroelectric can be sufficiently read through a combination of the optimized thickness of the dielectric film and the optimized gate voltage without damaging the good characteristics of the ferroelectric capacitor or the connected transistor characteristics.

Further, since the above-described ferroelectric memory is of a non-destructive read system, it is also released from the problem of deterioration of fatigue characteristics of the ferroelectric.

In addition, in order to operate a simple matrix type ferroelectric memory, squareness and reliability of its hysteresis are important. By the use of a material, $PbZr_{0.2}Ti_{0.6}Nb_{0.2}O_3$ ($PbSiO_3$ is added by 2 mol %) that overcomes the defects of the conventional ferroelectric material, we confirmed its stable operation as well as its reliability.

Also, in accordance with the present invention, a transistor section and a ferroelectric capacitor section are formed independently from each other, and the independently formed transistor section and the ferroelectric capacitor section are separated, and then connected on a plastic substrate. Accordingly, interference between the hydrogen process and the oxidation process can be perfectly avoided, and processings to form various hydrogen barrier layers which cause an increase in the cost can be eliminated.

In this instance, in the memory structure of the present invention, its read transistor section is not limited by differences in its structure, such as, TFT, SOI, etc., and for example, when a TFT structure is used, it is known that, after it is formed on $SiO_2$ that is formed on a glass substrate by using TEOS, it can be readily separated by a certain means through generation of hydrogen contained in TEOS—$SiO_2$.

Also, when separating a ferroelectric capacitor, it has been discovered that it can be readily separated by using a difference between the thermal expansion coefficient of the ferroelectric capacitor and the thermal expansion coefficient of the ferroelectric capacitor forming substrate.

Further, a technology for solid-bonding a TFT transistor and a ferroelectric capacitor can be readily realized, since a technology to bond a solid metal and another solid metal (for example, aluminum+aluminum) under pressure with bonding auxiliary material added has already been put to practical use.

Lastly, let us consider as to whether a TFT transistor and a ferroelectric capacitor interfere with each other, when they have the same cell area, the capacity of the TFT transistor is CT, and the capacity of the ferroelectric capacitor is CF. In other words, let us consider the data retention characteristics. In this case, the relative dielectric constant of a Si semiconductor substrate is 4, and the thickness of the substrate is 150 μm. When it is assumed that a PZT-based ferroelectric is used as the ferroelectric capacitor, its relative dielectric constant is 1500, and its film thickness is 150 nm, $CF/CT \geq (1500 \times 1/(150 \times 10^{-9}))/(4 \times 1/(150 \times 10^{-6})) = 375000$, which means that the capacity of the ferroelectric capacitor is at least about 400000 times greater than the transistor capacity, and therefore the transistor capacity can almost be ignored.

Accordingly, in the present invention, the transistor section and the ferroelectric capacitor do not interfere with each other, and therefore they are free from the problem of deterioration of data retention characteristics.

The present invention proposes novel memory structures by combining the above, and most of the problems of the conventional ferroelectric memories can be solved by using the present invention.

BRIEF DESCRIPTION OF THE DRAWINGS

FIG. 7 is a schematic diagram of a simple matrix type ferroelectric memory array in accordance with an embodiment of the present invention;

DESCRIPTION OF THE PREFERRED EMBODIMENTS

A ferroelectric memory in accordance with an embodiment of the present invention is formed from the following 1–3:

1. Capacitor of Ferroelectric Memory Device

Figure 1:
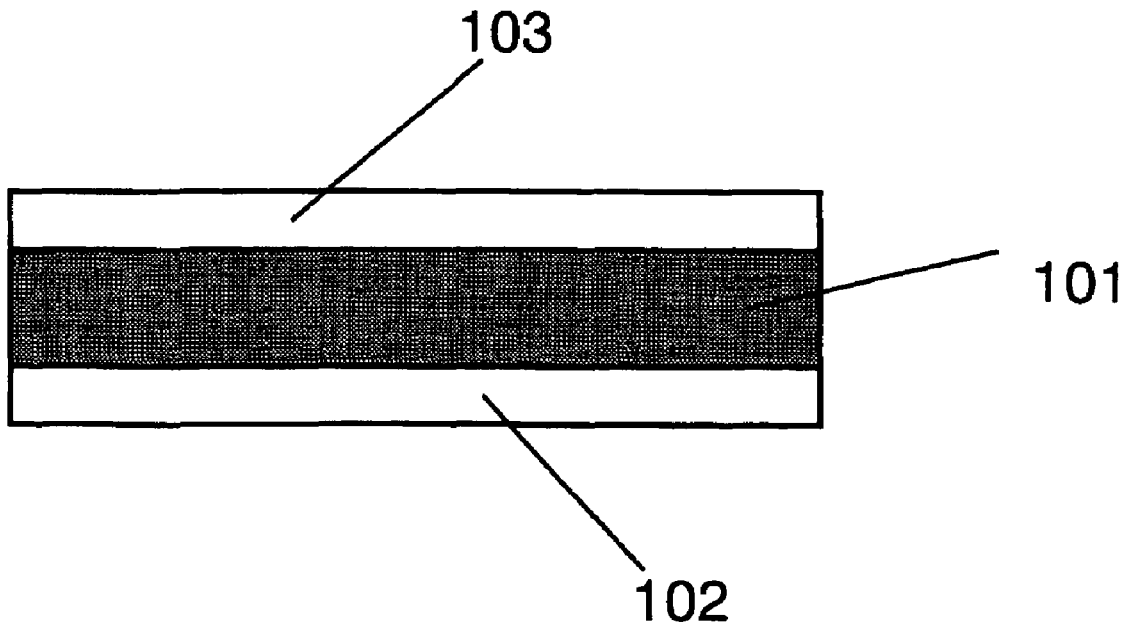
FIG. 1 is a view showing a structure of a ferroelectric capacitor in accordance with an embodiment of the present invention.

FIG. 1 is a view showing a ferroelectric capacitor in a ferroelectric memory device in accordance with an embodiment of the present invention. In FIG. 1, 101 denotes a PZTN ferroelectric film, 102 denotes a first electrode, and 103 denotes a second electrode. The first electrode 102 and the second electrode 103 are formed from a single noble metal such as Pt, Ir, Ru or the like, or a composite material containing as a main composition the aforementioned noble metal. If the elements of the ferroelectric diffuse into the first electrode, squareness of hysteresis deteriorates due to variations of the compositions at the interface section between the electrode and the ferroelectric film. Accordingly, the first electrode is required to have a density which does not allow diffusion of the elements of the ferroelectric. In order to increase the density of the first electrode, a method of forming a film by sputtering using a gas with a large mass, or a method of dispersing an oxide of Y, La, or the like into the noble metal electrode is employed. In FIG. 1, a substrate and other constituent elements of the ferroelectric memory device are omitted. These constituent elements are described below.

Next, an example of a film forming method for the PZTN thin film 101 is described later.

A first raw material liquid is a solution in which a condensation polymer for forming $PbZrO_3$ perovskite crystal with Pb and Zr among the constituent metal elements of the PZTN ferroelectric phase is dissolved in a solvent such as n-buthanol in an anhydrous state.

A second raw material liquid is a solution in which a condensation polymer for forming $PbTiO_3$ perovskite crystal with Pb and Ti among the constituent metal elements of the PZTN ferroelectric phase is dissolved in a solvent such as n-buthanol in an anhydrous state.

A third raw material liquid is a solution in which a condensation polymer for forming $PbNbO_3$ perovskite crystal with Pb and Nb among the constituent metal elements of the PZTN ferroelectric phase is dissolved in a solvent such as n-buthanol in an anhydrous state.

For example, when $PbZr_{0.2}Ti_{0.6}Nb_{0.2}O_3$ ferroelectric is to be obtained by using the first, second and third raw material liquids, they are mixed in a mixing ratio ((the first raw material liquid):(the second raw material liquid):(the third raw material liquid)) of 1:3:1, and further mixed with a solution in which a condensation polymer for forming $PbSiO_3$ crystal is dissolved in a solvent such as n-buthanol in an anhydrous state by 1 mol % or greater but less than 5 mol % to form a mixed solution. Further, methyl succinate is added to the mixed solution until its pH becomes 5.5.

The mixed liquid is used to repeat a series of steps consisting of a mixed solution coating step, a dry thermal treatment step, and a cleaning thermal treatment step a desired number of times, and a baking step is finally conducted to form a ferroelectric film.

Examples of the Conditions are Given Below.

The mixed liquid may be coated by a coating method such as spin coating. First, the mixed solution is dripped on a Si substrate covered with a noble metal for electrodes such as Pt or the like. In order to spread the dripped mixed solution over the entire substrate surface, the substrate is rotated at about 3000 rpm, and then the dry thermal treatment step is performed at temperatures at 150° C.–180° C.

The dry thermal treatment step is performed in the atmosphere, using a hot plate or the like.

Similarly, the cleaning thermal treatment step is performed in the atmosphere, using a hot plate that is maintained at 300° C.–350° C.

The sintering step for crystallization is performed, using thermal rapid anneal (RTA) in an oxygen atmosphere.

The thickness of the film after sintering is about 100–200 nm.

After forming the second electrode by sputtering or the like, post-annealing is performed for the purpose of forming the interface between the second electrode and the ferroelectric thin film and improving the crystallinity of the ferroelectric thin film, just like the baking step, in an oxygen atmosphere, using RTA or the like, to obtain a ferroelectric capacitor.

Figure 2:
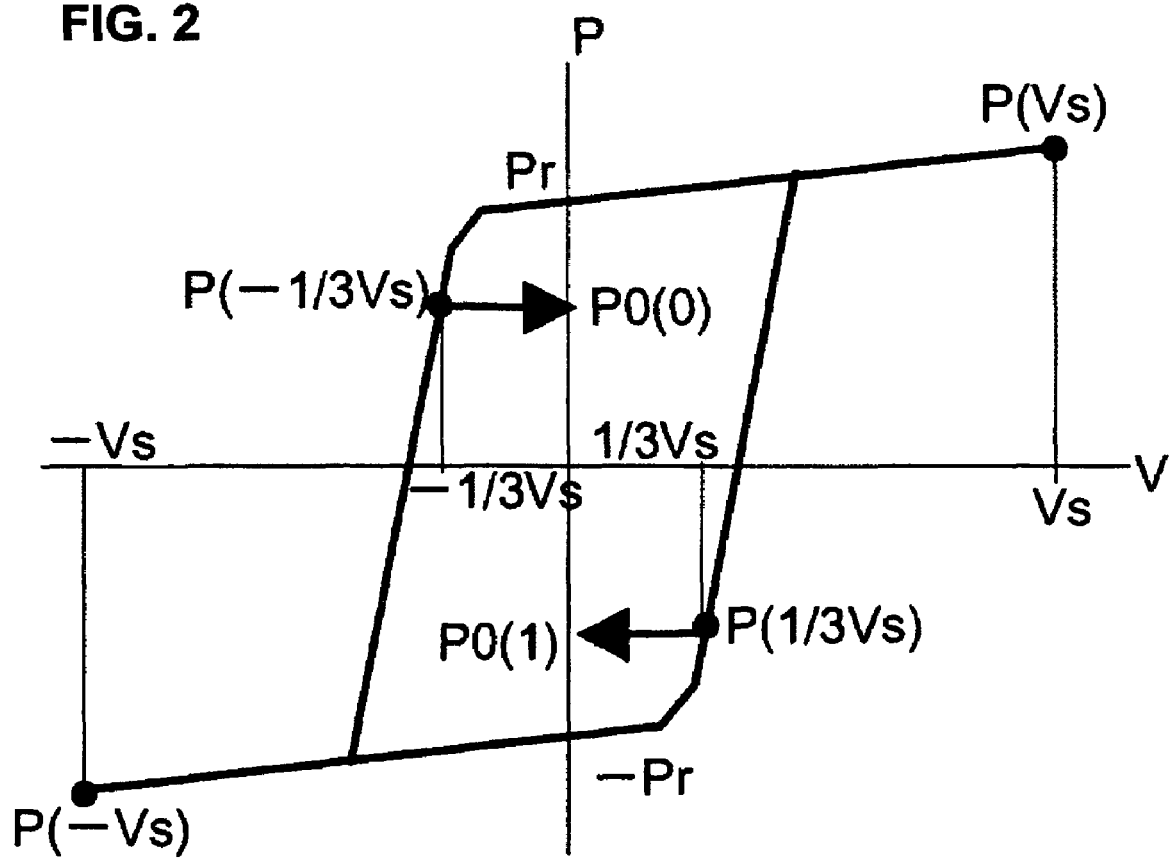
FIG. 2 is a view showing a P (polarization)–V (voltage) hysteresis curve of the ferroelectric capacitor in accordance with an embodiment of the present invention.

FIG. 2 is a view schematically showing a P (polarization)–V (voltage) hysteresis curve of the ferroelectric capacitor used in the present embodiment. This ferroelectric capacitor has a hysteresis curve in which the amount of polarization becomes P (+Vs) upon application of a voltage of +Vs, then the amount of polarization becomes Pr upon application of a voltage of 0, the amount of polarization becomes P (−1/3 Vs) upon application of a voltage of −1/3 Vs, the amount of polarization becomes P (−Vs) upon application of a voltage of −Vs, the amount of polarization becomes −Pr when the voltage is returned to 0, further the amount of polarization becomes P (+1/3 Vs) upon application of a voltage of +1/3 Vs, and the amount of polarization returns again to P (+Vs) when the voltage is returned to +Vs.

The present inventors have found the following characteristics of the ferroelectric capacitor used in the present embodiment. Namely, after applying a voltage of Vs once to cause the amount of polarization P (+Vs), a voltage of −1/3 Vs is applied, and the applied voltage is then changed to 0. In this case, the hysteresis loop follows a locus indicated by an arrow shown in FIG. 2, and the amount of polarization has a stable value of P0 (0). Also, after applying a voltage of −Vs once to cause the amount of polarization P (−Vs), a voltage of +1/3 Vs is applied and the applied voltage is then changed to 0. In this case, the hysteresis loop follows a locus indicated by an arrow shown in FIG. 2 and the amount of polarization has a stable value of P0 (1).

If the difference between the amount of polarization P0 (0) and the amount of polarization P0 (1) is sufficiently secured, a simple matrix type ferroelectric memory device can be operated by using the drive method disclosed in Japanese Laid-open Patent Application No. 9-116107 or the like.

According to the above ferroelectric capacitor, a decrease in crystallization temperature, an increase in squareness of the hysteresis, and an increase in Pr can be achieved. A simple matrix type ferroelectric memory device having such a ferroelectric capacitor can be driven. An increase in squareness of the hysteresis of the ferroelectric capacitor has significant effects on stability against disturbance, which is important for driving the simple matrix type ferroelectric memory device. In the simple matrix type ferroelectric memory device, since a voltage of ±1/3 Vs is also applied to cells which do not perform either writing or reading, the polarization must not be changed at this voltage, in other words, disturbance characteristics need to be stable. The present inventors have confirmed that the polarization of ordinary PZT is decreased by about 80% when a 1/3 Vs pulse is applied 10E8 times in the direction in which the polarization is reversed from a stable state, but the amount of decrease is 5% or less according to PZTN of the present invention.

Figure 3:
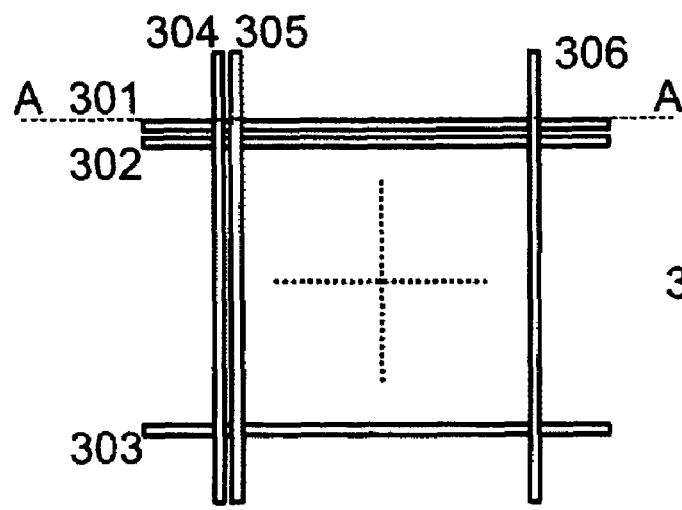
FIG. 3 includes views showing a structure of a ferroelectric memory device in accordance with an embodiment of the present invention in which memory cells are arranged in a simple matrix, wherein the FIG. (A) is a plan view thereof and the FIG. (B) is a cross-sectional view thereof.
Figure 3:
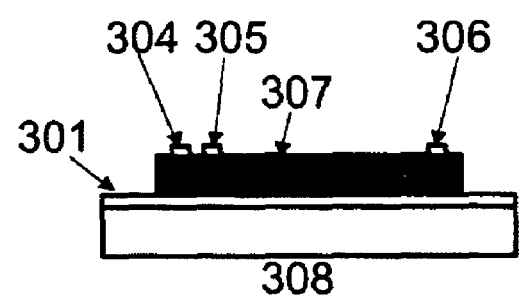

2. Ferroelectric Memory Device 2.1 Simple Matrix Type Ferroelectric Capacitor Write Device FIGS. 3(A) and (B) are views showing a configuration of the simple matrix type ferroelectric memory device of the present embodiment. FIG. 3(A) is a plan view thereof, and FIG. 3(B) is a cross-sectional view taken along a line A—A shown in FIG. 3(A). In FIG. 3(A), marks 301 to 303 denote a predetermined number of word lines arranged on a substrate 308, and marks 304 to 306 denote a predetermined number of bit lines arranged on the substrate 308. A PZTN ferroelectric film 307 of the prevent invention is interposed between the word lines 301 to 306 and the bit lines 304 to 306, wherein ferroelectric capacitors are formed in intersecting regions of the word lines and the bit lines.

In the ferroelectric memory device in which memory cells are arranged in a simple matrix, data is written in the ferroelectric capacitors formed in the intersecting regions of the word lines and the bit lines by an unshown peripheral driver circuit, reading amplifier circuit, and the like (which are referred to as "peripheral circuits"). The peripheral circuits may be formed by MOS transistors or TFT transistors on a substrate different from that of the memory cell array and connected with the word lines and the bit lines.

The ferroelectric capacitor used in the present embodiment substantially excels in squareness of the hysteresis and has stable disturbance characteristics. Moreover, in the ferroelectric capacitor, damages to the peripheral circuit and other elements are reduced due to the lowered process temperature, and process damage (reduction by hydrogen, in particular) is small, whereby deterioration of the hysteresis by damage can be suppressed. Therefore, a simple matrix type ferroelectric memory device can be driven by using such a ferroelectric capacitor.

2.2 Simple Matrix Type TFT Read Device

Figure 4:
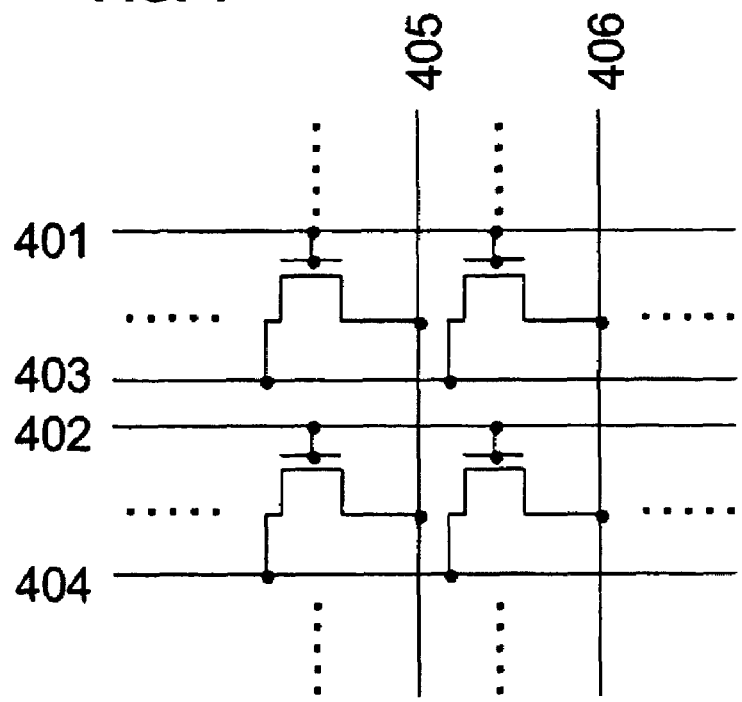
FIG. 4 is a view showing a TFT cell arrangement formed in a simple matrix in accordance with an embodiment of the present invention.

FIG. 4 is a view showing a configuration of the simple matrix type TFT device of the present embodiment. Marks 401 to 402 denote a predetermined number of word lines arranged on a substrate, marks 403 to 404 denote a predetermined number of source lines arranged, and marks 405 to 406 denote a predetermined number of drain lines arranged. The word lines 401 to 402 are connected to first gates of the TFTs, thereby forming the simple matrix type TFT read device.

In the simple matrix type TFT read device in which TFT cells are arranged in a simple matrix, reading from the TFTs is conducted by unshown peripheral driver circuit, reading amplifier circuit, and the like (which are referred to as "peripheral circuits"). The peripheral circuits may be formed by MOS transistors or TFT transistors on a substrate different from that of the TFT cell array and connected with the word lines, the source lines and the drain lines.

2.3 Non-destructive Read System Simple Matrix Type Ferroelectric Memory

Figure 5:
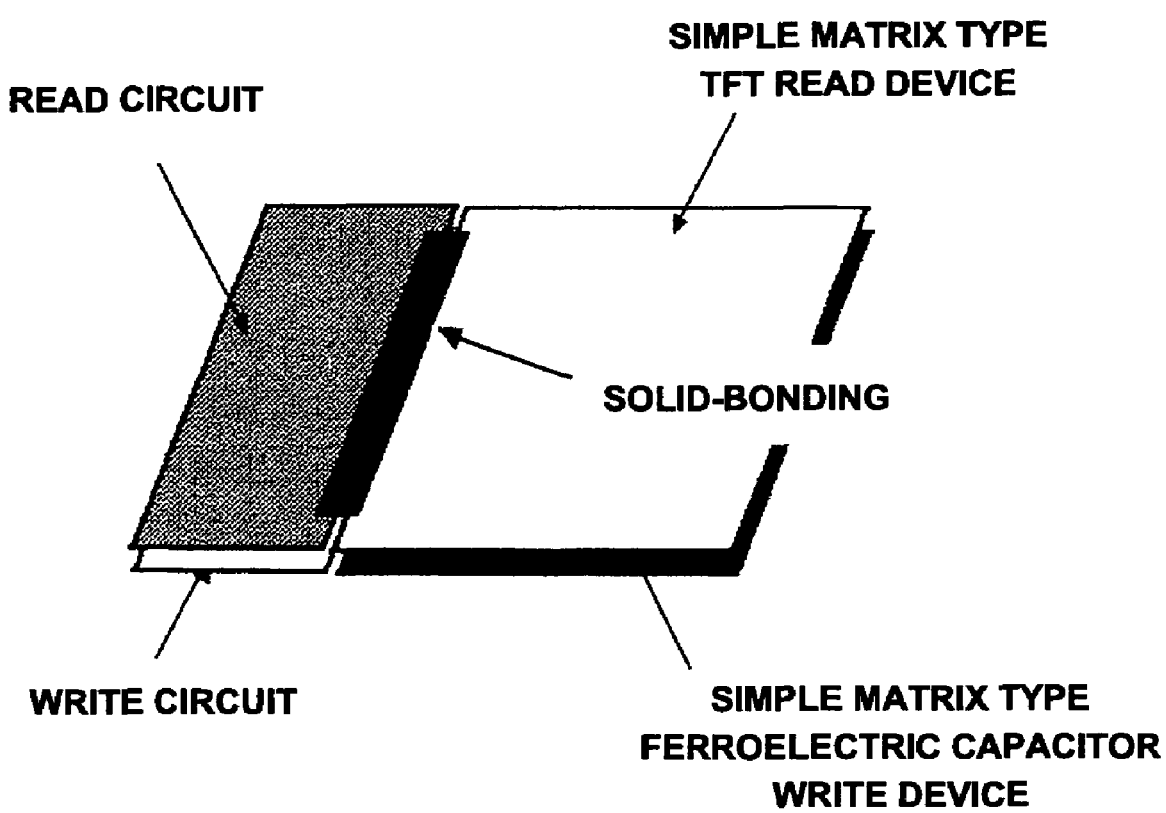
FIG. 5 is a view showing a structure of a non-destructive read system simple matrix type ferroelectric memory in accordance with an embodiment of the present invention in which a simple matrix type ferroelectric capacitor write device, a simple matrix type TFT read device and a peripheral circuit with TFT are solid-bonded together.
Figure 6:
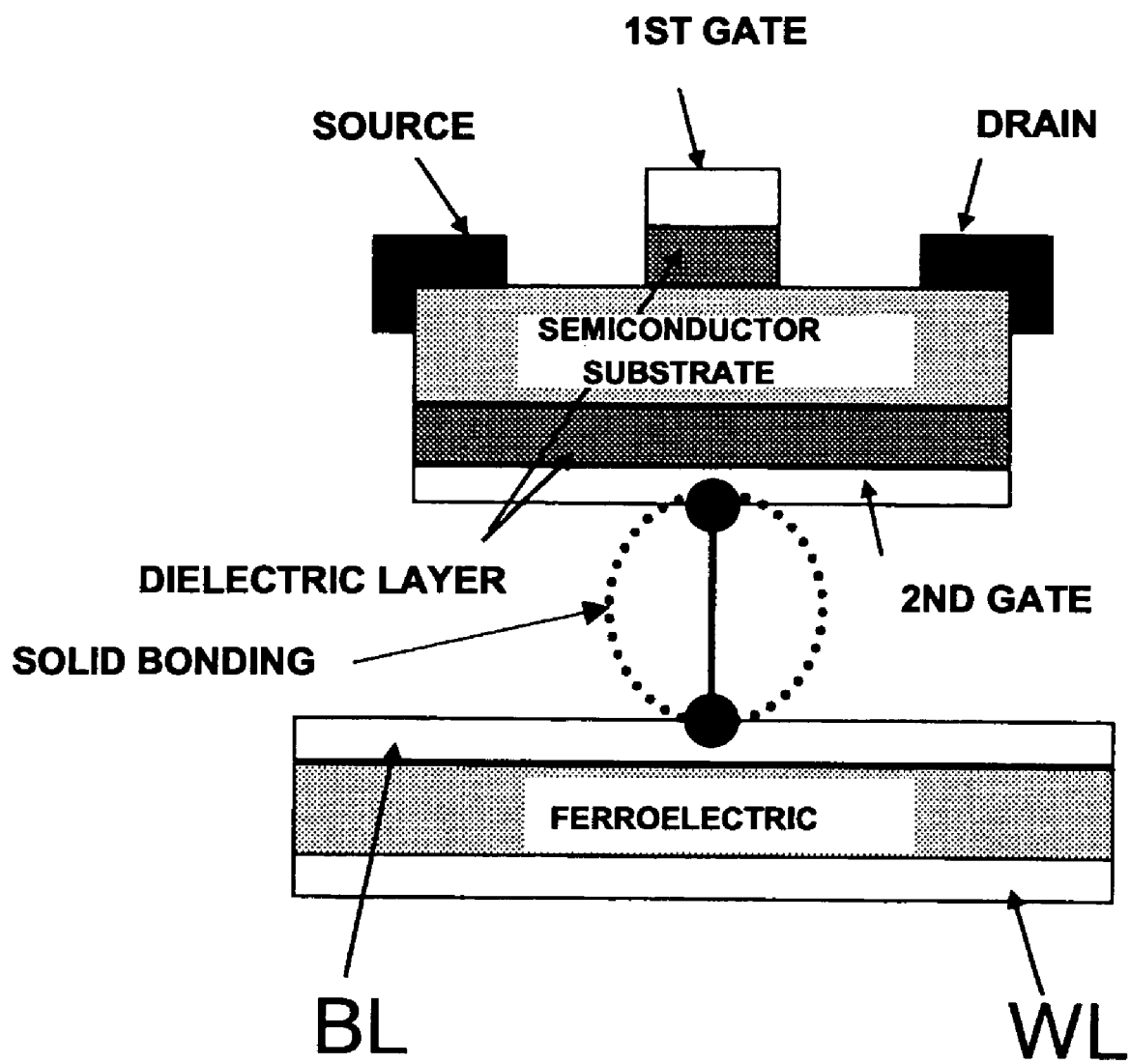
FIG. 6 is a view showing a structure of a non-destructive read system simple matrix type ferroelectric memory cell in accordance with an embodiment of the present invention.

As shown in FIG. 5, in a non-destructive read system simple matrix type ferroelectric memory device in accordance with the present invention, a simple matrix type TFT read device is disposed immediately above a simple matrix type ferroelectric capacitor write device described above, wherein each of the capacitors and each of the TFT are connected in series one to one through solid-bonding between the capacitor's bit line and the TFT's second gate, as shown in FIG. 6.

A charge stored due to polarization of the ferroelectric capacitor is injected through the second gate of the TFT as carriers of the Si substrate of the TFT, which appears as a difference in the carrier density in the Si substrate of the TFT depending on the direction of polarization, and which can eventually be read as a difference in the drain current.

Embodiment examples of the present invention are described below in detail.

(Fabrication of Simple Matrix Type Ferroelectric Memory)

(Embodiment Example 1)

A 1-kbit simple matrix type ferroelectric memory shown in FIGS. 7(A) and (B) is fabricated by using PZTN.

In this case, an ordinary silicon process is used, and it is equipped with a peripheral circuit that uses C-MOS transistors, and is capable of writing and reading.

In order to achieve a complete operation of a simple matrix type ferroelectric memory, selection of ferroelectric material having good squareness of hysteresis and excellent reliability is important as described above, which are almost impossible to achieve by conventional ferroelectric material.

Accordingly, we used $PbZr_{0.2}Ti_{0.6}Nb_{0.2}O_3$ (PZTN) as ferroelectric material, which was based on tetragonal $PbZr_{0.2}Ti_{0.8}O_3$ (PZT) having excellent squareness of hysteresis, and 20% of Ti was replaced with Nb.

Then, to a solution in which a sol-gel solution for forming $PbZrO_3$ (solvent: n-buthanol) in concentration of 10 wt. % in which the amount of excess Pb was 10%, a sol-gel solution for forming $PbTiO_3$ (solvent: n-buthanol) in concentration of 10 wt. % in which the amount of excess Pb was 10%, and a sol-gel solution for forming $PbNbO_3$ (solvent: n-buthanol) in concentration of 10 wt. % in which the amount of excess Pb was 10% were mixed in a ratio of 1:3:1, a 5 mol % of a sol-gel solution for forming $PbSiO_3$ (solvent: n-buthanol) in concentration of 10 wt. % was further added, and 150 nm-PZTN ferroelectric thin films were formed under the following film forming conditions:

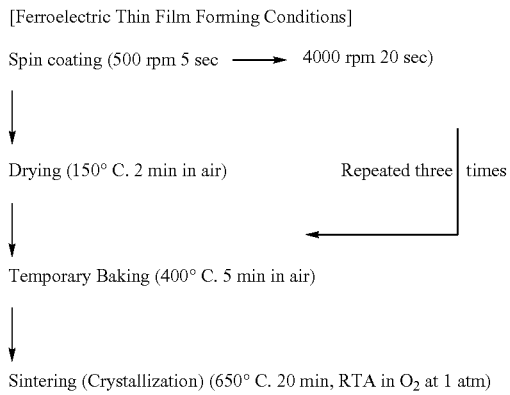

[Ferroelectric Thin Film Forming Conditions]

Spin coating (500 rpm 5 sec → 4000 rpm 20 sec)
↓
Drying (150° C. 2 min in air)    Repeated three times
↓
Temporary Baking (400° C. 5 min in air)
↓
Sintering (Crystallization) (650° C. 20 min, RTA in $O_2$ at 1 atm)

Figure 8:
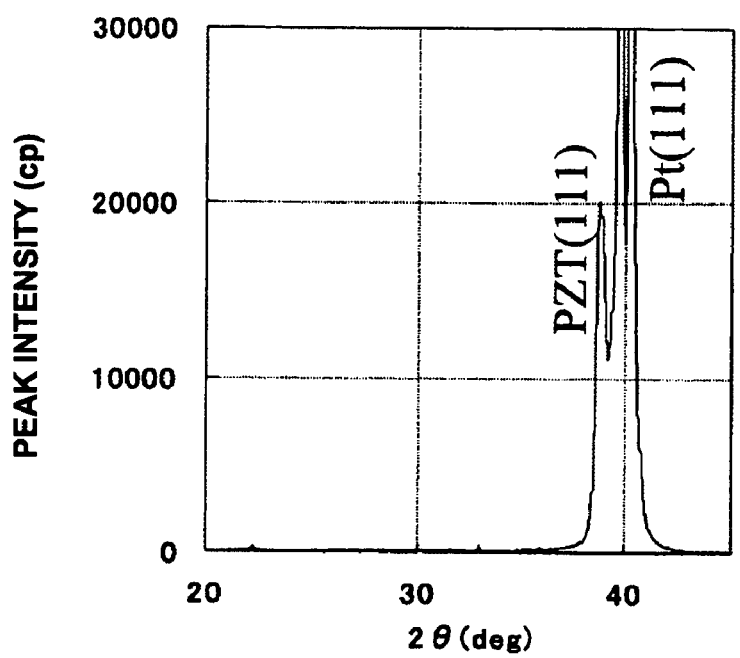
FIG. 8 is a view showing XRD patterns of a PZTN thin film in accordance with an embodiment of the present invention.

XRD patterns in this case, as shown in FIG. 8, indicated generally a (111) single oriented film.

Next, after forming a Pt electrode having a diameter of 100 μm φ and a film thickness of 100 nm by a vapor deposition method on the above-described PZTN thin film, ferroelectric characteristics were evaluated.

Figure 9:
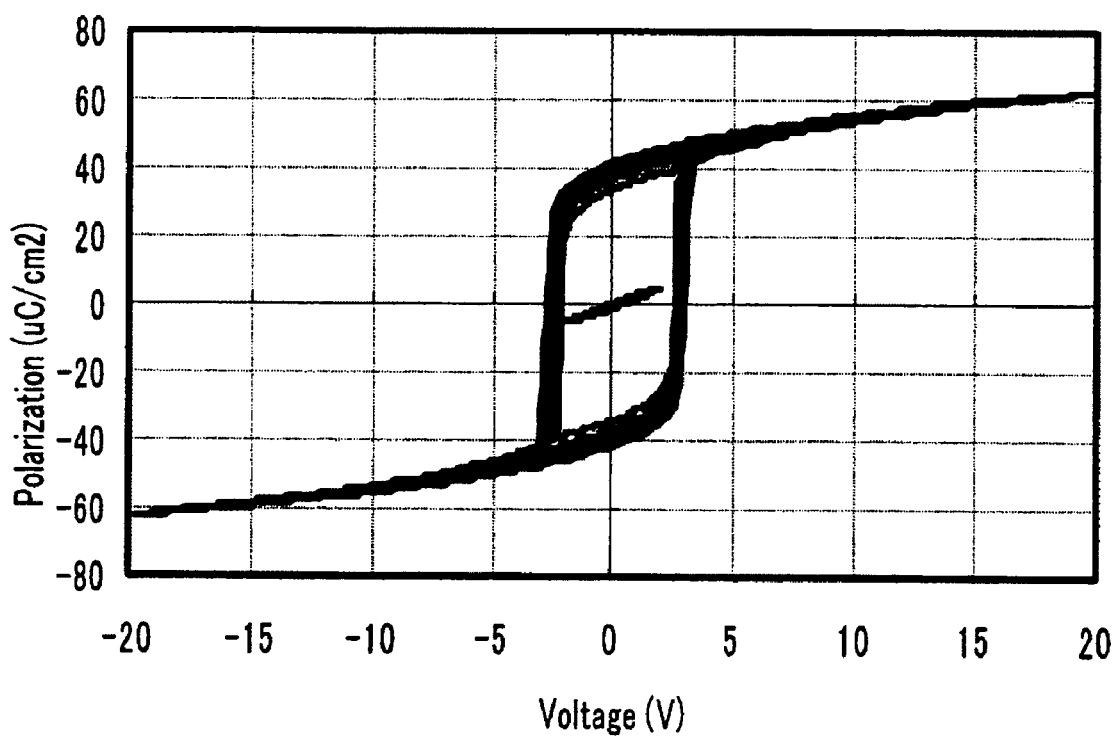
FIG. 9 is a view showing a hysteresis characteristic of a PZTN thin film in accordance with an embodiment of the present invention.

In this instance, hysteresis characteristics shown in FIG. 9 were obtained.

Figure 10:
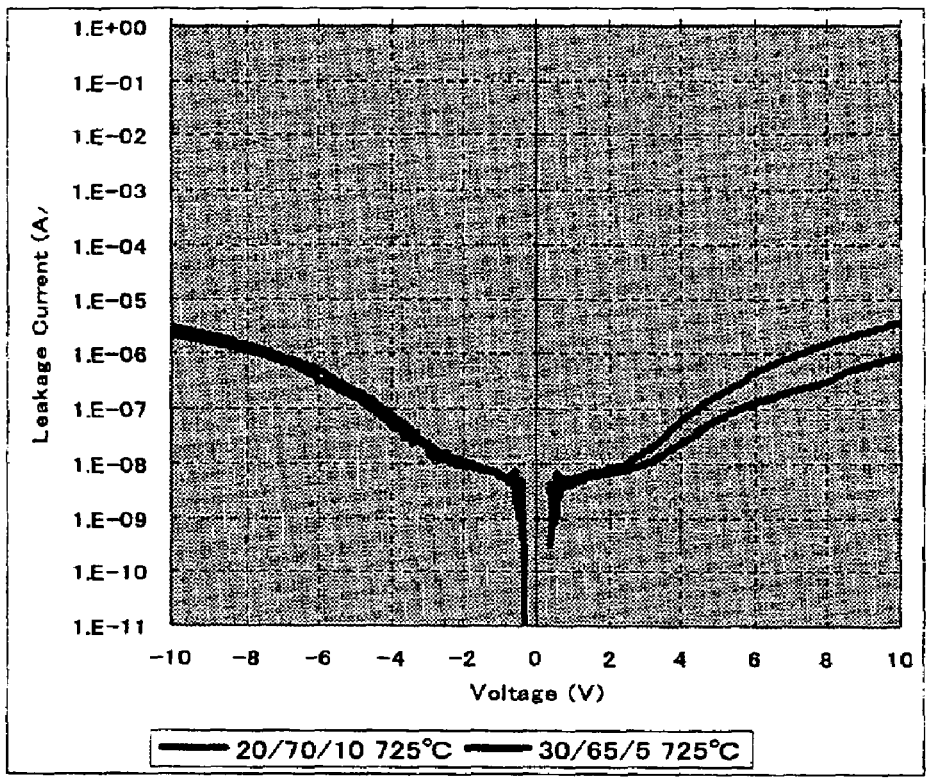
FIG. 10 is a view showing leakage current characteristics of a PZTN thin film in accordance with an embodiment of the present invention.

Also, as shown in FIG. 10, the leakage characteristics were also very good, which was 7E-9A/cm2 at an applied voltage of 2V (at the time of saturation).

Figure 11:
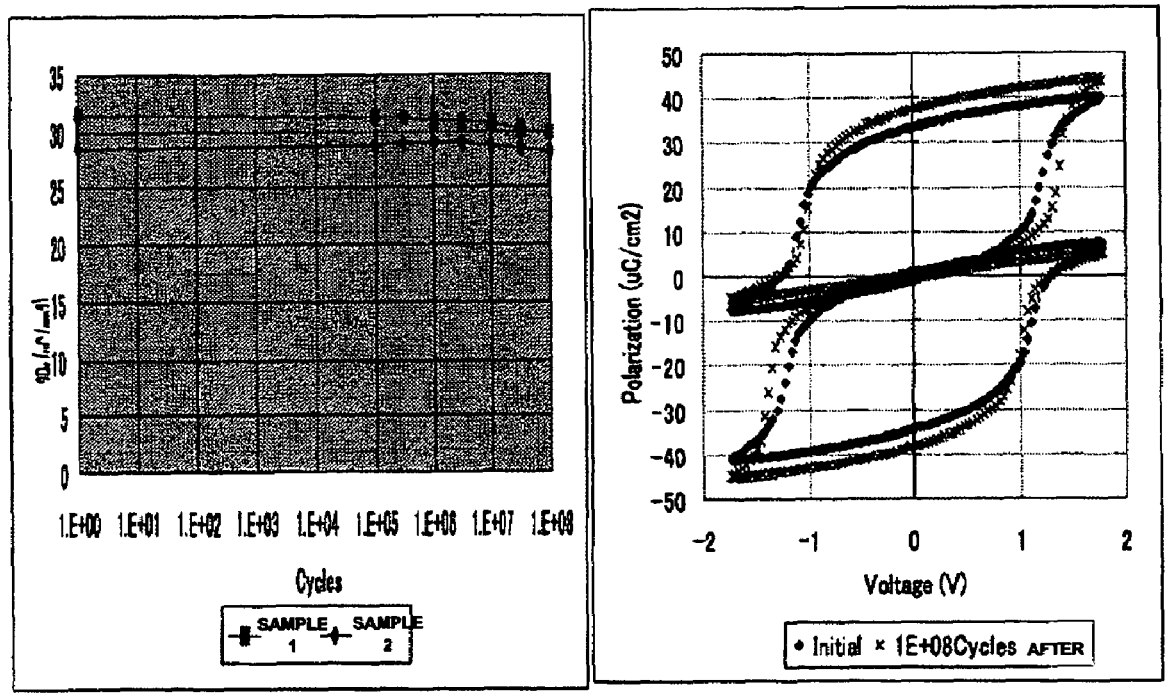
FIG. 11 includes views showing fatigue characteristics and static imprint characteristics of PZTN thin films in accordance with an embodiment of the present invention.

Next, fatigue characteristics and static imprint characteristics of the PZTN thin film were measured, and it was found that, as shown in FIG. 11, they were excellent.

In particular, the fatigue characteristics were excellent despite the fact that Pt was used for the upper and lower electrodes.

Figure 12:
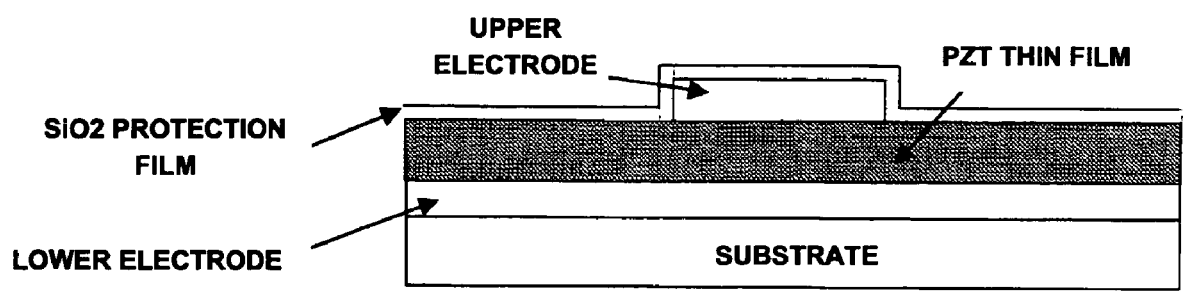
FIG. 12 is a view showing a structure of a capacitor with a $SiO_2$ protection film formed by ozone TEOS film in accordance with an embodiment of the present invention.

Further, as shown in FIG. 12, $SiO_2$ was coated on the present PZTN capacitor by using ozone TEOS.

It is known that, when $SiO_2$ is coated on a conventional PZT by using ozone TEOS, hydrogen that is generated from the TEOS reduces the PZT through the upper Pt, and the PZT crystal is destroyed to the extent that the PZT shows no hysteresis at all.

Figure 13:
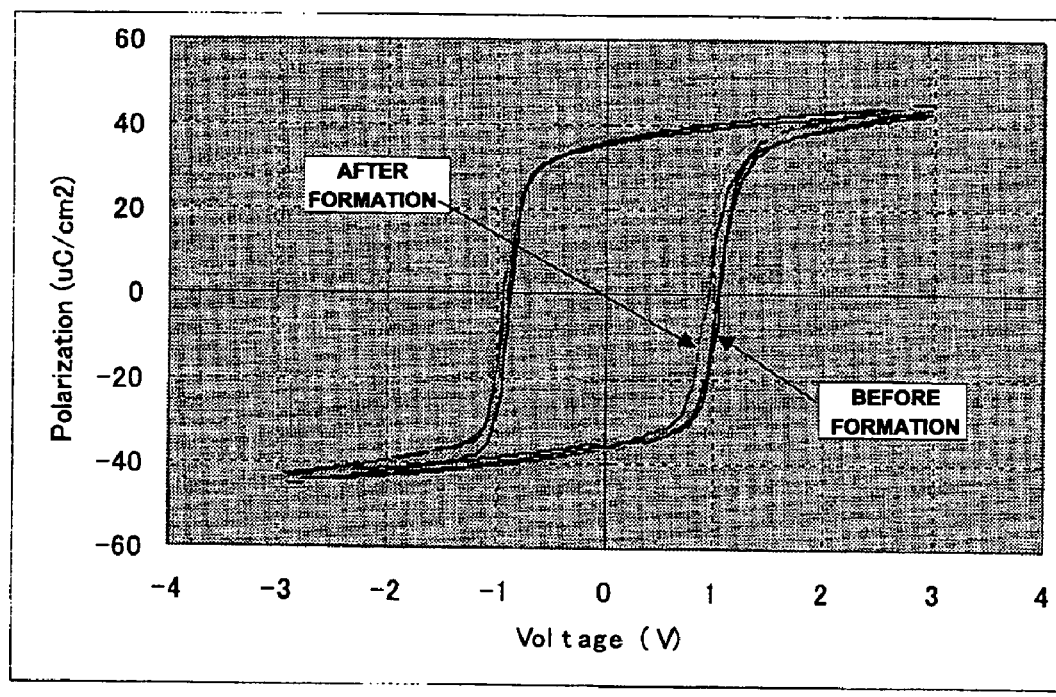
FIG. 13 is a view showing capacitor characteristics after a $SiO_2$ protection film is formed by ozone TEOS in accordance with an embodiment of the present invention.

However, the present PZTN thin film maintained good hysteresis showing almost no deterioration, as shown in FIG. 13, and it was found that its reduction resistance was very strong.

Next, conventional PZT thin films were evaluated.

Next, Pb:Zr:Ti of the conventional PZT thin films were 1:0.2:0.8, 1:0.3:0.7, and 1:0.6:0.4, respectively.

Figure 14:
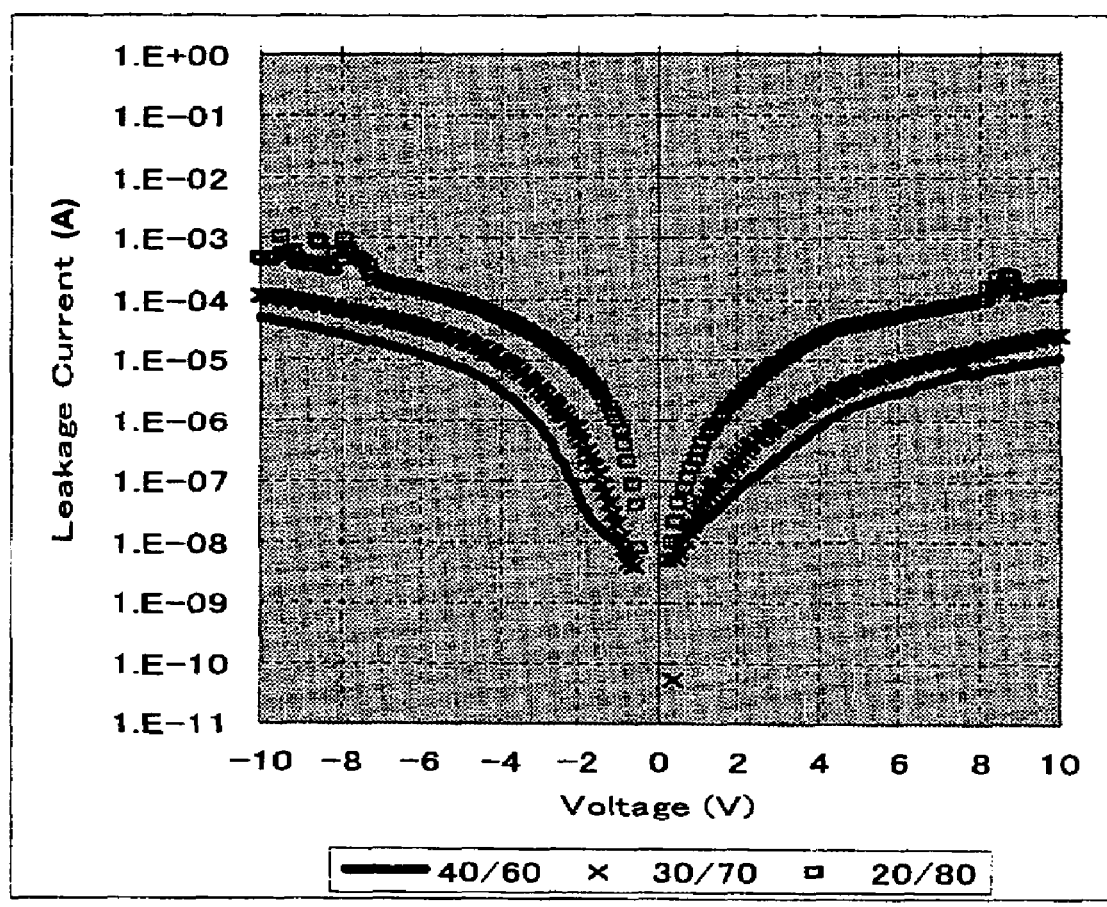
FIG. 14 is a view showing leakage current characteristics of conventional PZT thin films in accordance with an embodiment of the present invention.

As shown in FIG. 14, the more the amount of Ti content, the more the leakage characteristics deteriorated, and it was found that, when Ti content was 80%, it was $10-5A/cm^2$ at an applied voltage of 2V, which was not suitable for memory applications.

Figure 15:
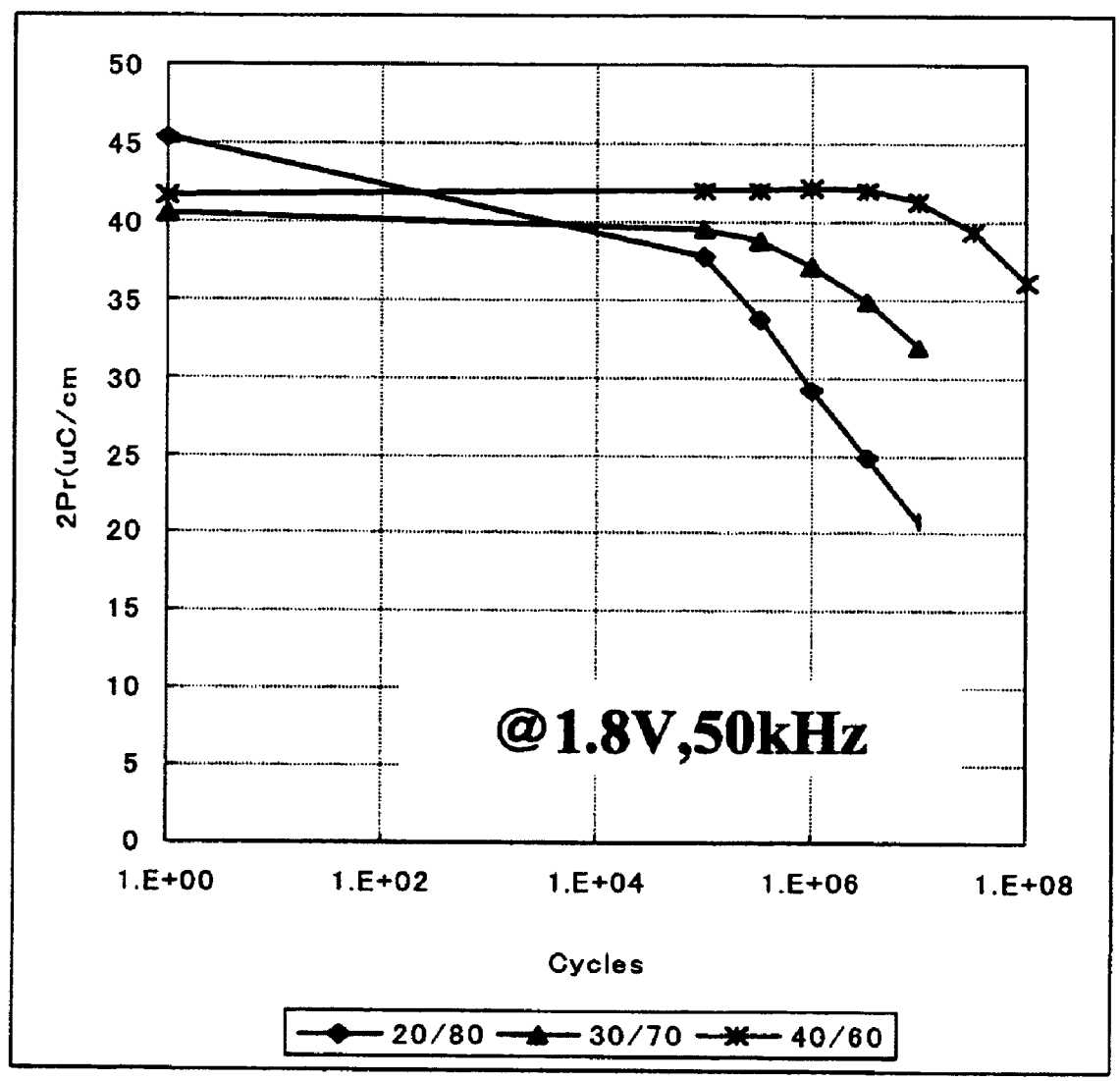
FIG. 15 is a view showing fatigue characteristics of conventional PZT capacitors in accordance with an embodiment of the present invention.

Similarly, as shown in FIG. 15, the more the amount of Ti content, the more the fatigue characteristics deteriorated.

Figure 16:
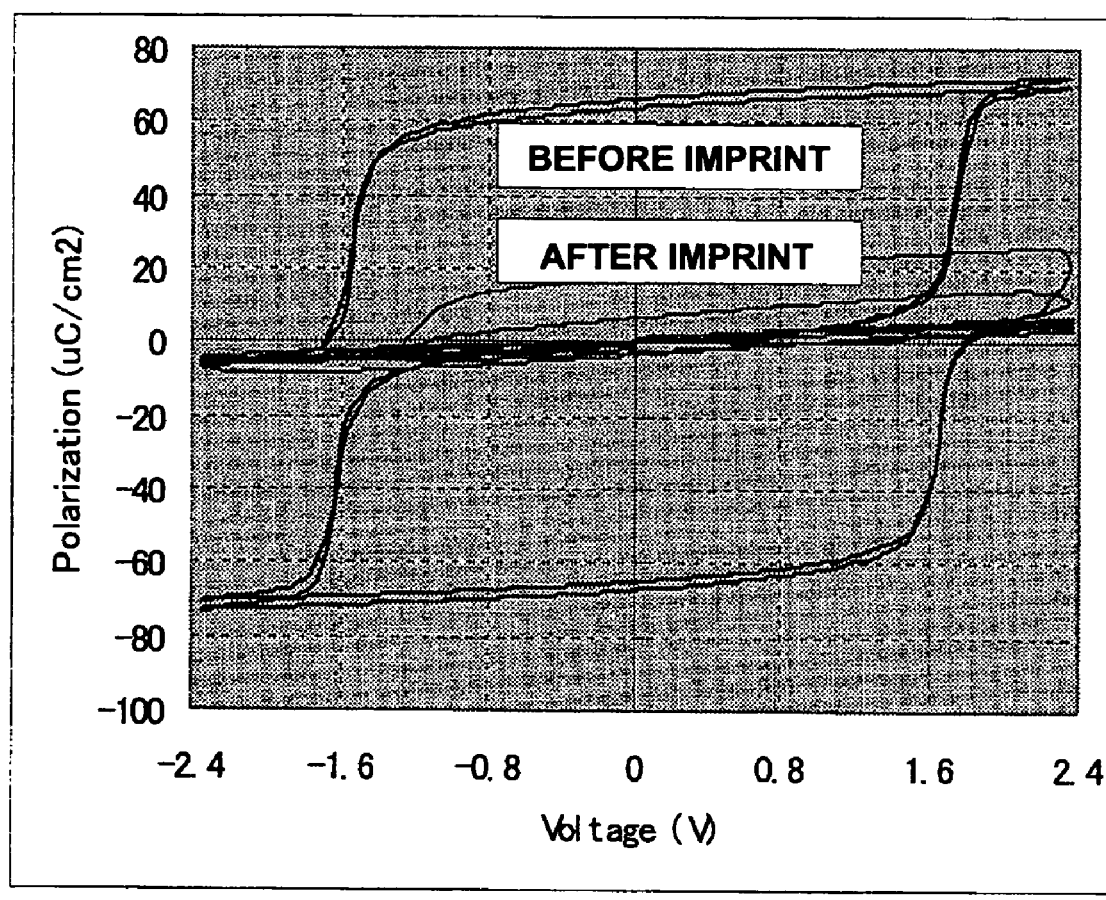
FIG. 16 is a view showing static imprint characteristics of a conventional PZT capacitor in accordance with an embodiment of the present invention.

Further, it was found that, after imprint, data could barely be read, as shown in FIG. 16.

It is understood from the embodiment examples above that the present PZTN thin films not only solved the problems of increased leakage current and deterioration of imprint characteristics which were thought to derive from the essence of conventional PZT, but also made tetragonal PZT, which had not been used for the reasons described above, possible to be used in memory applications without regard to the kind and structure of the memories.

Figure 17:
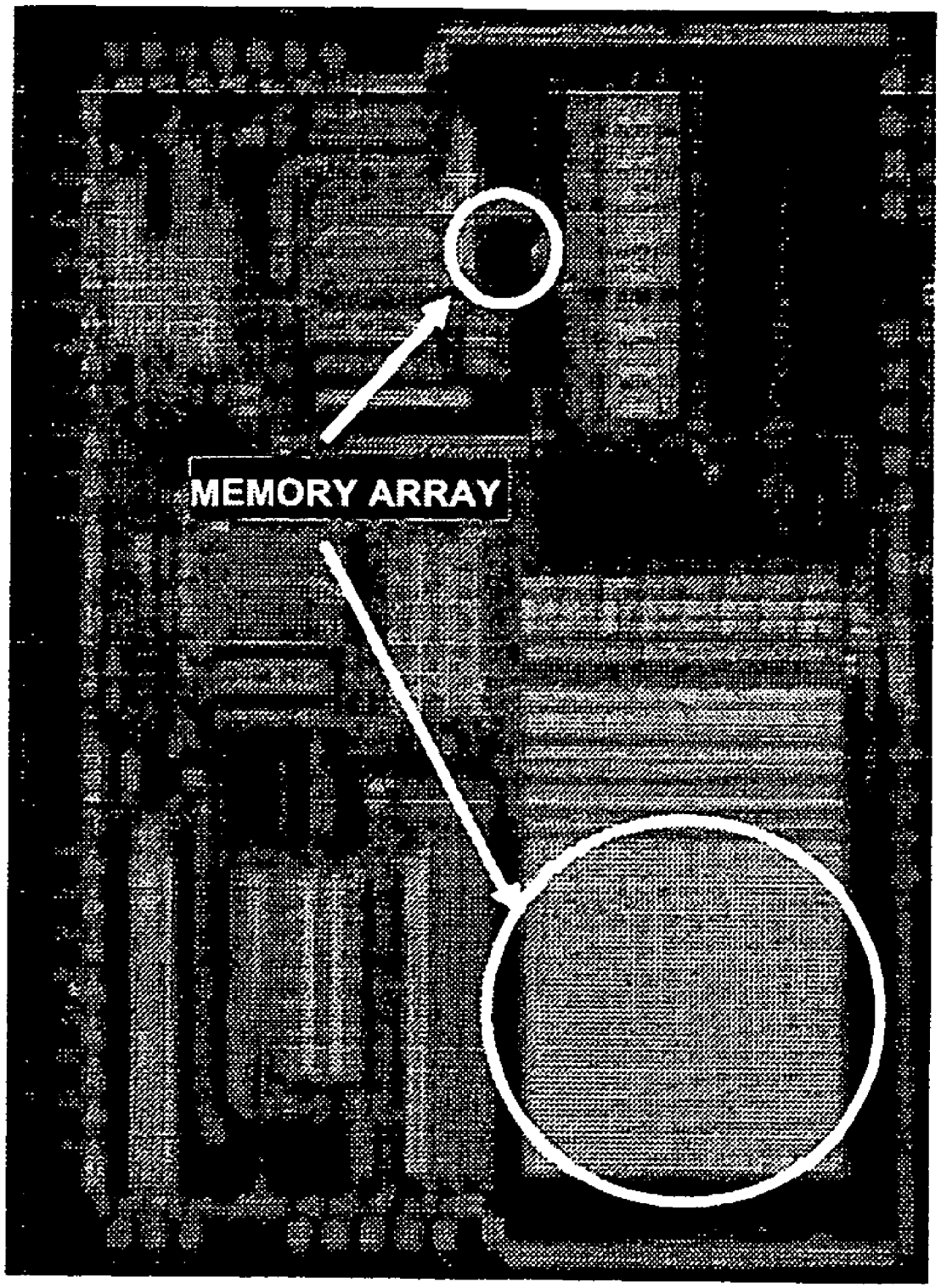
FIG. 17 is a metal microscopic photograph of a ferroelectric memory device in accordance with an embodiment of the present invention in which memory cells are arranged in a simple matrix.

Further, a memory array shown in FIG. 17 was fabricated by using the PZTN thin films described above.

Figure 18:
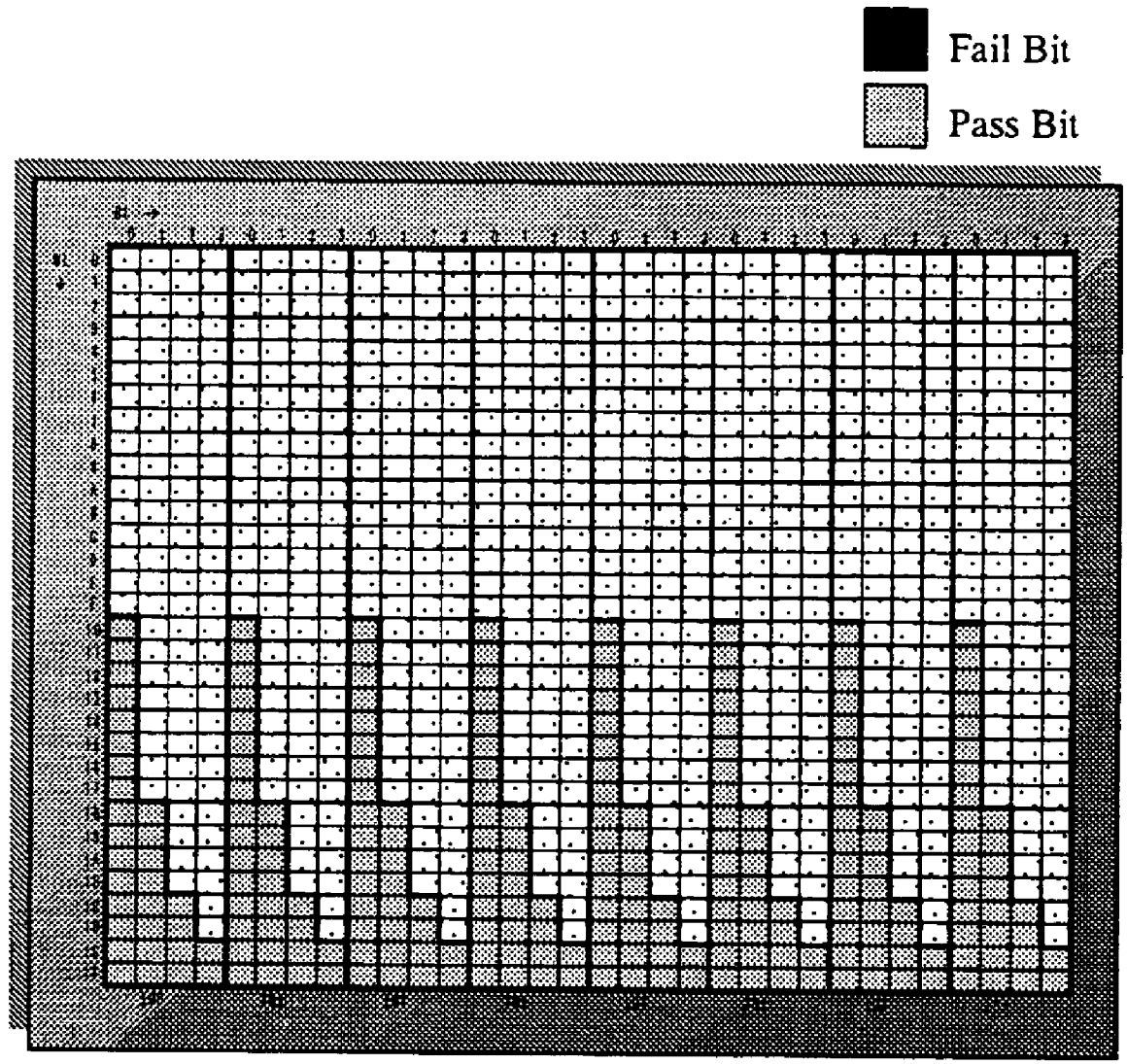
FIG. 18 is a fail bit map of a ferroelectric memory device in accordance with an embodiment of the present invention in which memory cells are arranged in a simple matrix.

A fail bit map obtained in this time is shown in FIG. 18, and it was confirmed that the entire 1 kbits operated at a drive voltage of 1.8 V (with a reference voltage Vref=1.1 V).

(Non-Destructive Read System Simple Matrix Type Ferroelectric Memory)

(Embodiment Example 2)

In the present embodiment example, a coplanar type TFT having a gate length of 0.5 μm and a gate dielectric film thickness Tox=50 nm was fabricated on a glass substrate.

Figure 19:
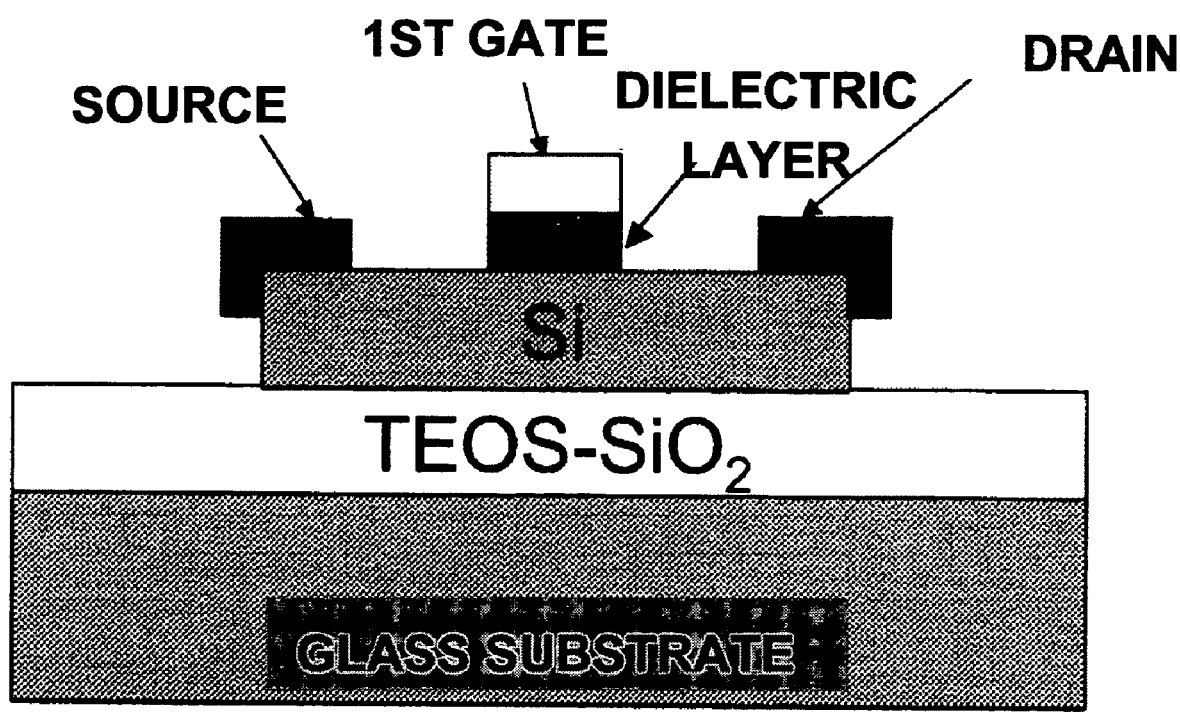
FIG. 19 is a cross-sectional view of a TFT cell formed on a glass substrate in accordance with an embodiment of the present invention.

In this instance, the device had a cross section shown in FIG. 19; and by irradiating a laser beam with an appropriate wavelength from the side of the glass substrate, $H_2$ is generated from the TEOS—$SiO_2$, and the TFT alone can be separated.

Figure 20:
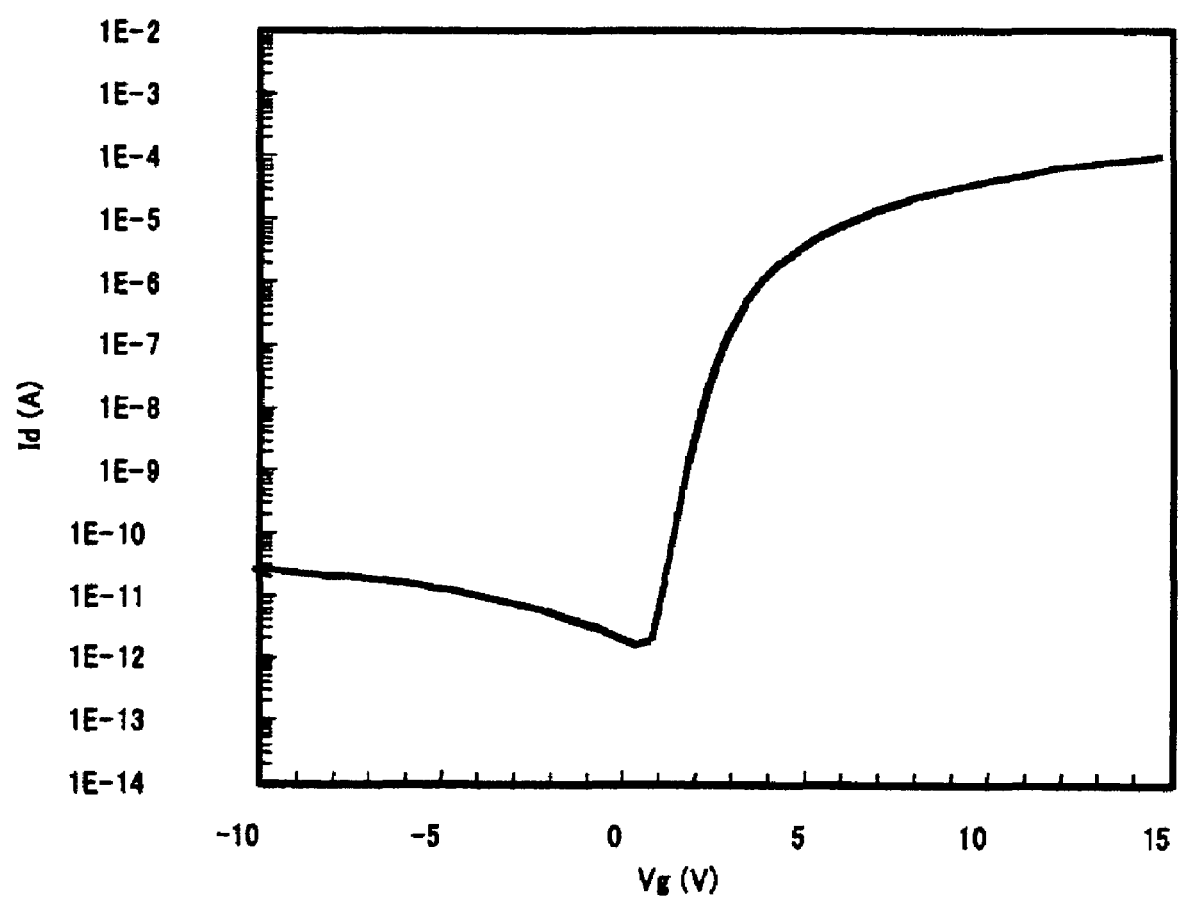
FIG. 20 is a view showing Id-Vg characteristics of a TFT formed on a glass substrate in accordance with an embodiment of the present invention.

FIG. 20 shows Id-Vg characteristics obtained when the drain voltage Vd=3.3 V, and the gate voltage was changed. The mobility was about 500.

Next, since the back of the separated TFT was composed of a Si substrate, $SiO_2$ having a thickness of 50 nm was formed on the Si surface, and Al was further vapor-deposited to form a second gate electrode.

Further, Al was vapor-deposited as an upper electrode of the ferroelectric PZTN capacitor, which gave a cell size of 1.3 μm×1.3 μm.

The second gate Al electrode of the separated TFT was placed on the upper Al electrode of the PZTN capacitor, which were then solid-bonded through pressure-bonding for one hour at 400° C. in an $N_2$ atmosphere in a 9.9 atm environment.

Figure 21:
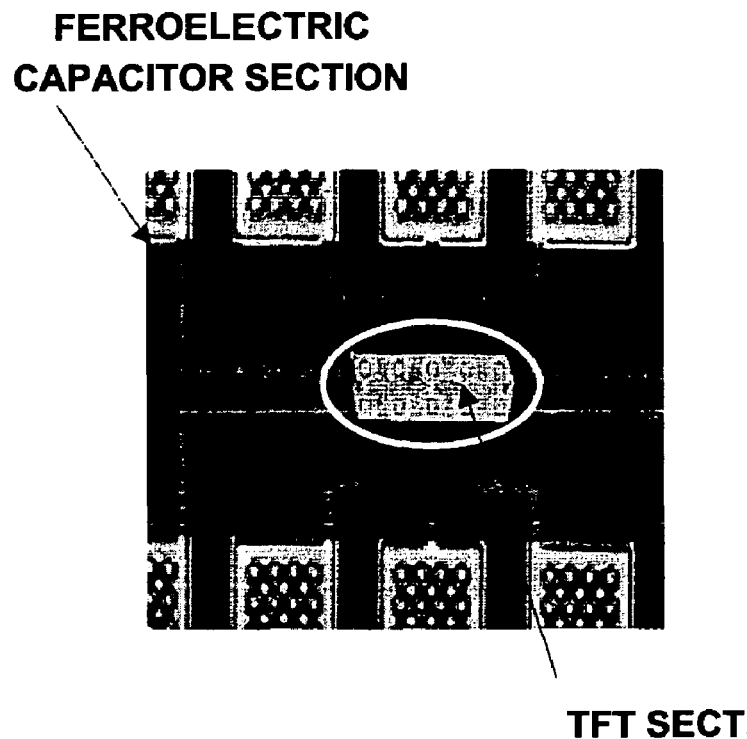
FIG. 21 is a metal microscopic photograph of a memory cell in accordance with an embodiment of the present invention in which a ferroelectric capacitor and a TFT are solid-bonded.
Figure 22:
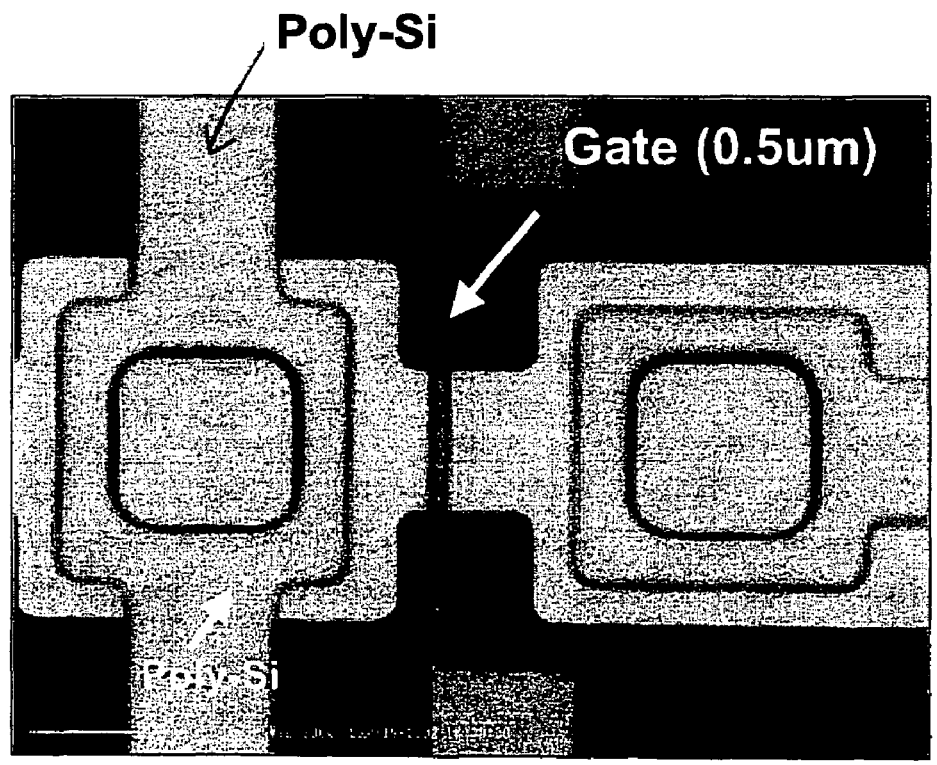
FIG. 22 is an enlarged metal microscopic photograph of a memory cell in accordance with an embodiment of the present invention in which a ferroelectric capacitor and a TFT are solid-bonded.

A metal microscopic photograph of the completed device is shown in FIG. 21, and an enlarged photograph of the bonded TFT is shown in FIG. 22.

Figure 23:
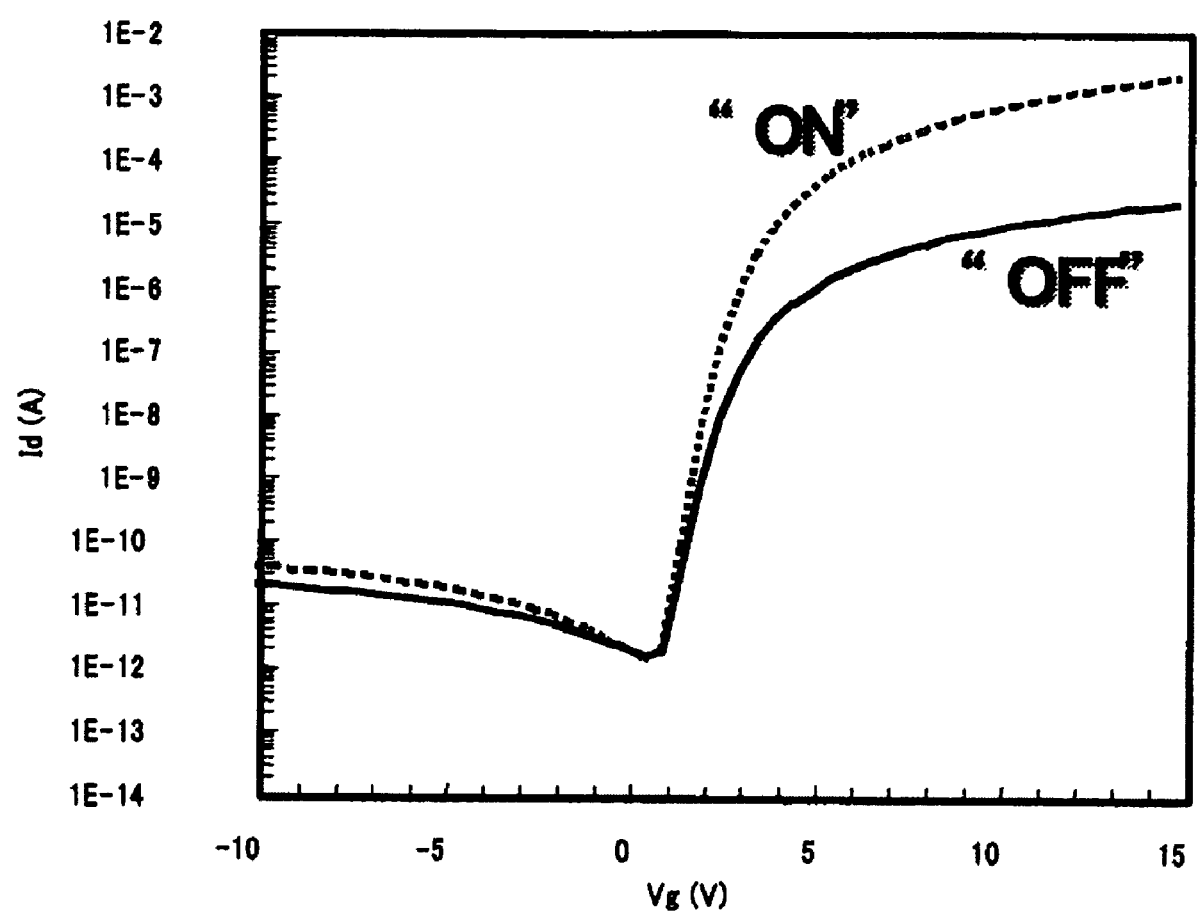
FIG. 23 is a view showing Id-Vg characteristics of a non-destructive read system simple matrix type ferroelectric memory cell in accordance with an embodiment of the present invention.

Then, the polarization of the ferroelectric capacitor was reversed by applying ±2V, and Id-Vg characteristics were measured with the drain voltage Vd=3.3V, while changing the gate voltage, as shown in FIG. 23.

In this manner, depending on the direction of polarization of the ferroelectric capacitor, the transistor characteristics showed two states, and an excellent non-destructive read effect was confirmed.

Figure 24:
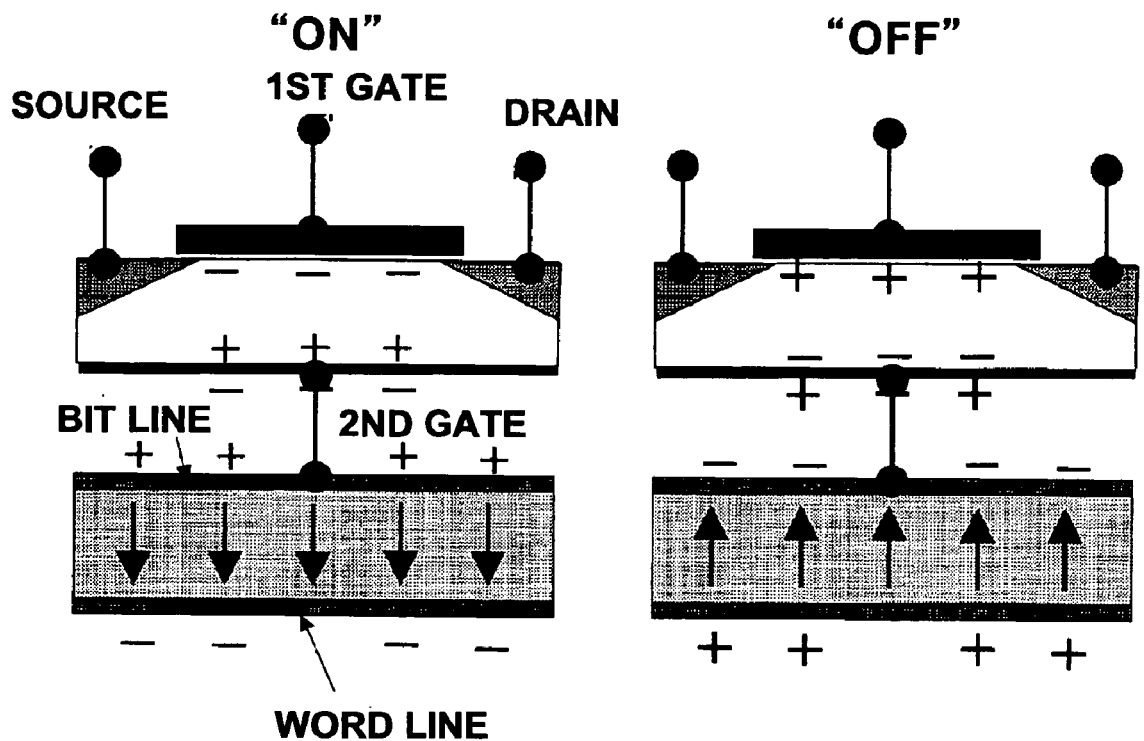
FIG. 24 is a view showing an operation principle of a non-destructive read system simple matrix type ferroelectric memory cell in accordance with an embodiment of the present invention.

In other words, as FIG. 24 indicates, when the amount of change in the carrier density of the semiconductor substrate is decided by optimizing the dielectric film thickness at the bonded section of the ferroelectric capacitor and the semiconductor substrate, and by optimizing the gate voltage, the difference in the amount of stored charge caused by polarization inversion of the ferroelectric can be sufficiently read out by the combination of the optimized dielectric film thickness and gate voltage without deteriorating the excellent characteristics of the ferroelectric capacitor or transistor characteristics bonded at all.

Figure 25:
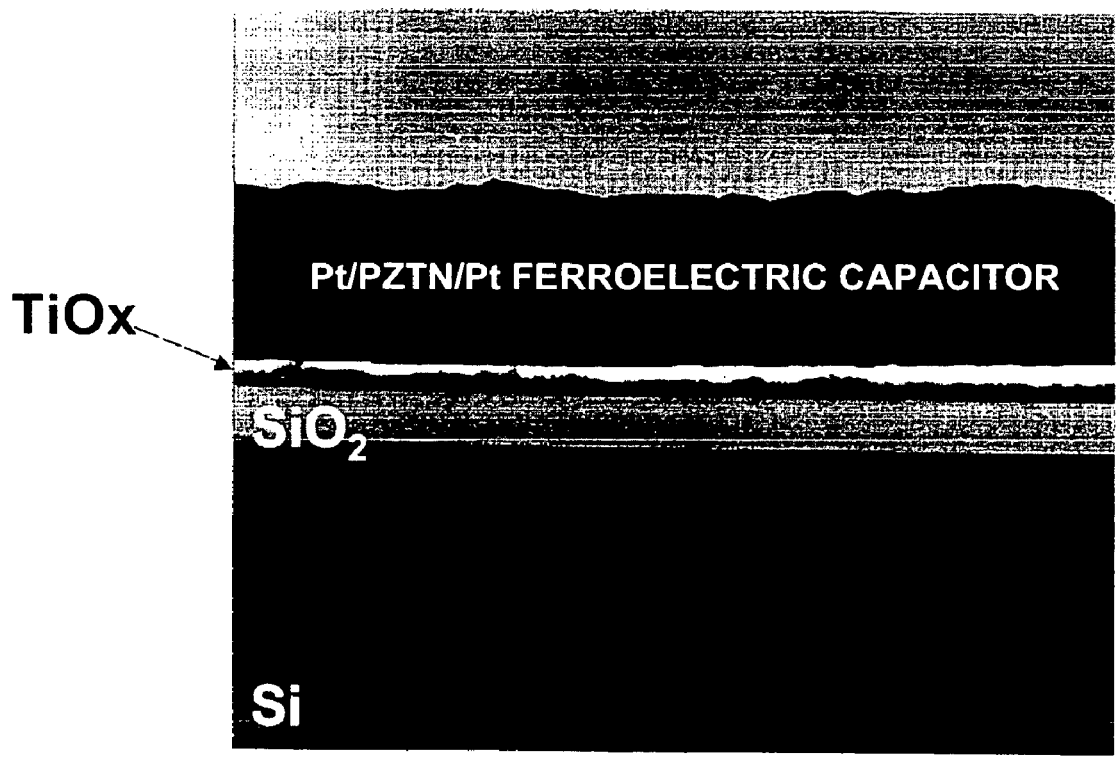
FIG. 25 is a TEM photograph of a cross section of a ferroelectric capacitor that is separated by using a difference in coefficients in thermal expansion in accordance with an embodiment of the present invention.

Next, a substrate having Pt/PZTN/Pt/TiOx/$SiO_2$/Si structure was heated in $N_2$ at 400° C. for 10 min, and then placed on a stainless steel table to be rapidly cooled, and then its temperature was again elevated at a temperature elevating rate of 10° C./min to 400° C. It was found that the TiOx and the lower Pt could be separated from each other, as shown in FIG. 25.

The above takes advantage of the facts that a Si substrate has a small coefficient of expansion and a high distortion point (temperature at which a distortion takes place) which is as high as about 1000° C., and ceramics such as PZT have a low distortion point of about 400° C., and since a ferroelectric capacitor having a distortion has an abnormal expansion, a ferroelectric capacitor can be separated, by using these facts.

Figure 26:
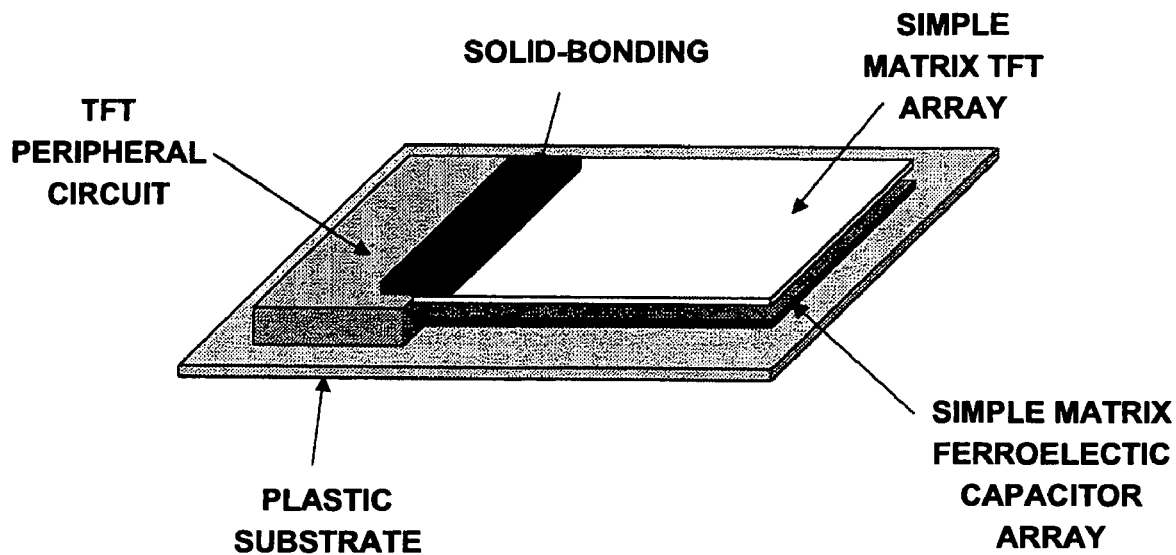
FIG. 26 is a view showing a non-destructive read system simple matrix type ferroelectric memory array formed on a plastic substrate in accordance with an embodiment of the present invention.

By making use of the above, TFTs and bonded ferroelectric capacitor cells are separated, and a memory device can be formed with them on any substrate such as a plastic substrate, or the like, as shown in FIG. 26.

Figure 27:
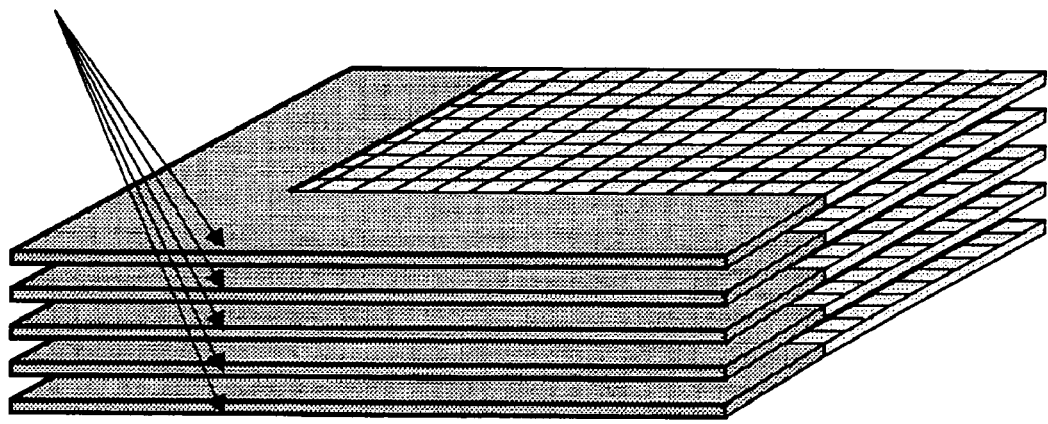
FIG. 27 is a view showing a large capacity memory array in accordance with an embodiment of the present invention in which non-destructive read system simple matrix type ferroelectric memory arrays are integrated.

Also, by laminating and solid-bonding substrates according to FIG. 26, a higher integration can be achieved, as shown in FIG. 27.

What is claimed is:

1. A memory device comprising:
    a semiconductor substrate;
    a transistor formed by using the semiconductor substrate; and
    a capacitor directly connected to the semiconductor substrate;
    wherein changes in electric conductivity of the semiconductor substrate are used as different data;
    the transistor reads the data; and
    a density of carriers (electrons) of the semiconductor substrate is changed by changing the amount of charge stored in the capacitor.

2. The memory device according to claim 1, further comprising:
    a region for controlling an active region, the region for controlling the active region including a source, a drain, and a depletion region including a gate formed on the semiconductor substrate; and
    a region for controlling a carrier density of the semiconductor substrate itself from a region of the semiconductor substrate other than the region for controlling the active region;
    wherein the region for controlling the active region and the region for controlling the carrier density of the semiconductor substrate inject a charge stored in ferroelectric into the semiconductor substrate.

3. The memory device according to claim 1, further comprising:
    a ferroelectric capacitor;
    wherein the ferroelectric capacitor uses differences in an amount of stored charge and polarity caused by a polarization inversion of the ferroelectric as changes in a carrier density of the semiconductor substrate, and uses a nonvolatility of a remnant polarization of the ferroelectric.

4. The memory device according to claim 3, wherein a plurality of ferroelectric capacitors are arranged in a simple matrix structure.

5. The memory device according to claim 4, wherein an electric field is applied externally to the ferroelectric capacitor to write data.

6. The memory device according to claim 3, wherein the ferroelectric used for the ferroelectric capacitor has an oxygen octahedral structure.

7. The memory device according to claim 3, wherein the ferroelectric used for the ferroelectric capacitor has an oxygen octahedral structure, and is present in a mixed state with a paraelectric material having at least one of a catalytic action and an action to reduce crystallization temperature of the ferroelectric material.

8. The memory device according to claim 7, wherein the ferroelectric having the oxygen octahedral structure is at least one of a perovskite and bismuth layer structured oxide shown by $ABO_3$ or $(Bi_2O_2)^{2+}(A_{m-1}B_mO_{3m+1})^{2-}$ (wherein A represents one element or two or more elements selected from the group consisting of Li, Na, K, Rb, Pb, Ca, Sr, Ba, Bi, La, and Hf, B represents one element or two or more elements selected from the group consisting of Ru, Fe, Ti, Zr, Nb, Ta, V, W, and Mo, and m is a natural number of 5 or less), and a tungsten bronze structured material shown by $A_{0.5}BO_3$ (tetragonal bronze structure) or $A_{0.3}BO_3$ (hexagonal bronze structure) (wherein A represents one element or two or more elements selected from the group consisting of Li, Na, K, Rb, Cs, Pb, Ca, Sr, Ba, Bi, nd La, and B represents one element or two or more elements selected from the group consisting of Ru, Fe, Ti, Zr, Nb, Ta, V, W, and Mo).

9. The memory device according to claim 8, wherein the material having at least one of a catalytic action and an action to reduce crystallization temperature of the ferroelectric material is a layered compound including an oxygen tetrahedral structure formed from a mixture of one or more compounds selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$, and $V_2O_5$, and $SiO_2$ or $SiO_2$ and $GeO_2$.

10. The memory device according to claim 7, wherein the ferroelectric material has a leakage current density of $10{-}8 A/cm^2$ or less in an electric field region of 3V or lower.

11. A memory device comprising:
    a semiconductor substrate;
    a first dielectric layer disposed on a surface of the semiconductor substrate;
    a first gate disposed on the first dielectric layer;
    a second dielectric layer disposed on another surface of the semiconductor substrate, the another surface being opposite to the surface including the first dielectric layer;
    a second gate disposed on the second dielectric layer;
    a source and a drain region formed in the semiconductor substrate; and
    a ferroelectric capacitor connected to the second gate.

12. A memory device comprising;
    a semiconductor layer;
    a first dielectric layer disposed on a surface of the semiconductor layer;
    a first gate disposed on the first dielectric layer;
    a second dielectric layer disposed on another surface of the semiconductor layer, the another surface being opposite to the surface including the first dielectric layer;
    a second gate disposed on the second dielectric layer;
    a source and a drain region formed in the semiconductor layer; and
    a ferroelectric capacitor connected to the second gate.

* * * * *